(12) United States Patent
Nielsen

(10) Patent No.: US 12,126,314 B2
(45) Date of Patent: Oct. 22, 2024

(54) ACTIVE FEEDBACK ANALOG FILTERS WITH COUPLED RESONATORS

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 1 day.

(21) Appl. No.: 17/216,942

(22) Filed: Mar. 30, 2021

(65) Prior Publication Data
US 2021/0305968 A1    Sep. 30, 2021

Related U.S. Application Data

(60) Provisional application No. 63/002,304, filed on Mar. 30, 2020.

(51) Int. Cl.
*H03H 11/00* (2006.01)
*H03G 3/30* (2006.01)
*H03H 11/12* (2006.01)

(52) U.S. Cl.
CPC ........... *H03H 11/12* (2013.01); *H03G 3/3036* (2013.01)

(58) Field of Classification Search
CPC .... H03H 111/12; H03H 7/0115; H03H 7/175; H03H 2210/04; H03H 7/1775; H03G 3/3036
See application file for complete search history.

(56) References Cited

U.S. PATENT DOCUMENTS

| | | |
|---|---|---|
| 1,570,771 A | 1/1926 | Nyquist |
| 1,778,085 A | 10/1930 | Nyquist |
| 1,915,440 A | 6/1933 | Nyquist |
| 1,926,169 A | 9/1933 | Nyquist |
| 2,099,769 A | 11/1937 | Nyquist |
| 3,720,881 A | 3/1973 | Hurtig, III |
| 5,220,686 A | 6/1993 | Kasperkovitz et al. |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Tuan T Lam
(74) *Attorney, Agent, or Firm* — CHRISTENSEN O'CONNOR JOHNSON KINDNESS PLLC

(57) ABSTRACT

A variable filter for an RF circuit has a signal loop comprising a signal input port and a signal output port, and a plurality of circuit elements connected within the signal loop. The plurality of circuit elements comprise a multi-pole resonator comprising a plurality of frequency tunable resonators and an adjustable scaling block that applies a gain factor. Adjacent frequency tunable resonators within the multi-pole resonator are reciprocally coupled. A controller is connected to tune the multi-pole resonator and to adjust the gain factor of the adjustable scaling block such that the signal loop generates a desired bandpass response.

19 Claims, 22 Drawing Sheets

(56) References Cited

U.S. PATENT DOCUMENTS

| | | |
|---|---|---|
| 5,291,159 A | 3/1994 | Vale |
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,420,913 B1 | 7/2002 | Freeman |
| 6,452,465 B1 | 9/2002 | Brown et al. |
| 6,496,075 B2 | 12/2002 | Justice et al. |
| 6,587,007 B2 | 7/2003 | Exeter |
| 6,650,195 B1 | 11/2003 | Brunn et al. |
| 6,771,147 B2 | 8/2004 | Mongia |
| 6,865,387 B2 | 3/2005 | Bucknell et al. |
| 6,898,450 B2 | 5/2005 | Eden et al. |
| 6,920,315 B1 | 7/2005 | Wilcox et al. |
| 6,937,877 B2 | 8/2005 | Davenport |
| 6,941,118 B2 | 9/2005 | Yamamoto |
| 6,954,774 B1 | 10/2005 | Mulbrook |
| 7,098,751 B1 | 8/2006 | Wong |
| 7,151,925 B2 | 12/2006 | Ting et al. |
| 7,158,010 B2 | 1/2007 | Fischer et al. |
| 7,174,147 B2 | 2/2007 | Toncich et al. |
| 7,346,330 B2 | 3/2008 | Kawabe et al. |
| 7,400,203 B2 | 7/2008 | Ojo et al. |
| 7,414,779 B2 | 8/2008 | Huber et al. |
| 7,423,502 B2 | 9/2008 | Razafimandimby et al. |
| 7,433,668 B2 | 10/2008 | Fischer et al. |
| 7,509,141 B1 | 3/2009 | Koenck et al. |
| 7,522,016 B2 | 4/2009 | Toncich et al. |
| 7,809,410 B2 | 10/2010 | Palum et al. |
| 7,917,117 B2 | 3/2011 | Zafonte |
| 7,937,076 B2 | 5/2011 | Zeller et al. |
| 8,000,379 B2 | 8/2011 | Kishigami et al. |
| 8,050,708 B2 | 11/2011 | March et al. |
| 8,103,213 B2 | 1/2012 | Tolonen |
| 8,106,727 B2 | 1/2012 | Kawai et al. |
| 8,107,939 B2 | 1/2012 | Hassan et al. |
| 8,120,536 B2 | 2/2012 | Lindmark |
| 8,140,033 B2 | 3/2012 | Chan Wai Po et al. |
| 8,253,514 B2 | 8/2012 | Kharrat et al. |
| 8,294,537 B2 | 10/2012 | Kawai et al. |
| 8,565,671 B2 | 10/2013 | Robert et al. |
| 8,767,871 B2 | 7/2014 | Park et al. |
| 8,922,294 B2 | 12/2014 | Tsuzuki et al. |
| 8,981,875 B2 | 5/2015 | Park |
| 9,024,709 B2 | 5/2015 | Joshi et al. |
| 9,083,351 B1 | 7/2015 | Lee et al. |
| 9,129,080 B2 | 9/2015 | Tsuzuki et al. |
| 9,184,498 B2 | 11/2015 | Schiller |
| 9,231,712 B2 | 1/2016 | Hahn et al. |
| 9,407,239 B2 | 8/2016 | White et al. |
| 9,634,390 B2 | 4/2017 | Onaka |
| 9,641,138 B2 | 5/2017 | Zhu |
| 9,698,747 B2 | 7/2017 | Ishizuka |
| 10,050,604 B2 | 8/2018 | Nielsen et al. |
| 10,228,927 B2 | 3/2019 | Choi et al. |
| 10,236,899 B1 | 3/2019 | Tope et al. |
| 10,396,807 B1 | 8/2019 | Dai et al. |
| 2001/0043116 A1 | 11/2001 | Waltman |
| 2004/0030108 A1 | 2/2004 | Pihlava et al. |
| 2005/0003785 A1 | 1/2005 | Jackson et al. |
| 2007/0010217 A1 | 1/2007 | Takahashi et al. |
| 2007/0195915 A1* | 8/2007 | Ko ................. H03G 5/005 375/345 |
| 2007/0296513 A1 | 12/2007 | Ruile et al. |
| 2009/0322445 A1 | 12/2009 | Raidl et al. |
| 2010/0097152 A1 | 4/2010 | Wang et al. |
| 2010/0141355 A1 | 6/2010 | Kharrat et al. |
| 2011/0002080 A1 | 1/2011 | Ranta |
| 2011/0187448 A1 | 8/2011 | Koechlin |
| 2013/0065542 A1* | 3/2013 | Proudkii ............ H03H 11/1291 327/551 |
| 2013/0142089 A1 | 6/2013 | Azarnaminy et al. |
| 2013/0293291 A1 | 11/2013 | Shanan |
| 2014/0266454 A1 | 9/2014 | Testi et al. |
| 2014/0361839 A1 | 12/2014 | Scott et al. |
| 2016/0072442 A1 | 3/2016 | Testi et al. |
| 2016/0164481 A1 | 6/2016 | Madan et al. |
| 2017/0149411 A1 | 5/2017 | Nielsen et al. |
| 2018/0323770 A1* | 11/2018 | Nielsen ............. H03H 11/1208 |
| 2020/0014382 A1 | 1/2020 | Ranta |
| 2020/0153410 A1* | 5/2020 | Nielsen ............... H03H 9/6403 |
| 2021/0067125 A1 | 3/2021 | Nielsen |

FOREIGN PATENT DOCUMENTS

| | | |
|---|---|---|
| CN | 108463949 A * | 8/2018 |
| EP | 1675263 A1 | 6/2006 |
| EP | 3062442 A1 | 8/2016 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2009114123 A2 | 9/2009 |
| WO | 2011/103108 A1 | 8/2011 |
| WO | 2015/176041 A1 | 11/2015 |
| WO | 2018/215973 A1 | 11/2018 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE Mtt-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," Eee Journal of Solid-State Circuits 42(9):1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion mailed Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

(56) References Cited

OTHER PUBLICATIONS

Luo, X., et al., "Tunable Bandpass Filter With Two Adjustable Transmission Poles and Compensable Coupling," IEEE Transactions on Microwave Theory and Techniques 62(9):2003-2013, Sep. 2014.

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.

Piazza, G., "Mems Resonators for Frequency Control and Sensing Applications," presentation, University of Pennsylvania, Philadelphia [at least as early as Apr. 24, 2015], 104 pages.

Psychogiou, D., et al., "V-Band Bandpass Filter With Continuously Variable Centre Frequency," IET Microwaves, Antennas & Propagation 7(8):701-707, Jun. 2013.

Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.

Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.

Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.

Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.

Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.

Wang, S., and R.-X. Wang, "A Tunable Bandpass Filter Using Q-Enhanced and Semi-Passive Inductors at S-Band in 0.18-μM CMOS," Progress in Electromagnetics Research B 28:55-73, 2011.

Written Opinion of the International Preliminary Examining Authority mailed on Feb. 5, 2018, issued in corresponding International Application No. PCT/GB2016/053686, filed Nov. 23, 2016, 6 pages.

He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.

Gao, W. and W.S. Snelgrove, "A 950MHz Second-Order Integrated LC Bandpass Modulator" 1997 Symposium on VLSI Circuits Digest of Technical Papers, p. 111-112.

Zumbahlen, Hank: "Chapter 5: Analog Filters ; Section 5-6: Filter Realizations" In: "Op Amp Applications Handbook". Dec. 31, 2005, Newnes, Oxford, pp. 5.59-5.100.

Deliyannis, Theodore L, et al.: "5.6 Multiple-Loop Feedback Filters" In: "Continuous-Time Active Filter Design." Jan. 1, 1999, Boca Raton, FL: CRC Press, U.S. Pat. No. 028016 pp. 162-171.

\* cited by examiner

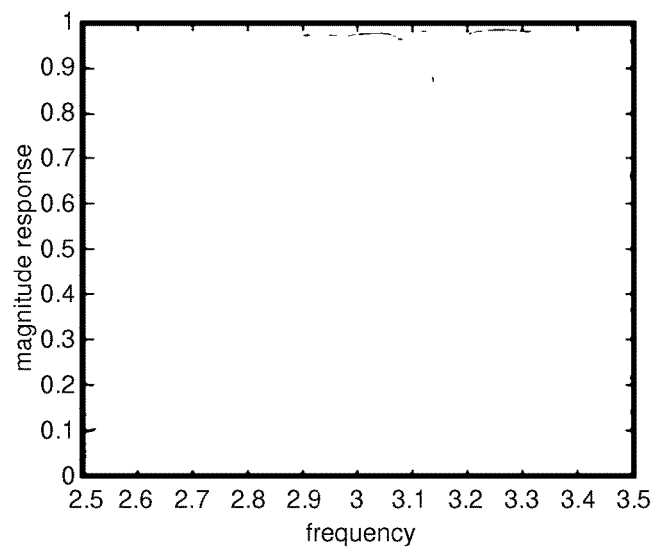
FIG. 27
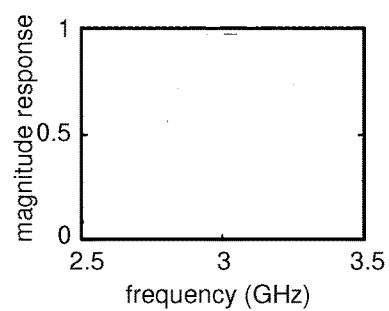 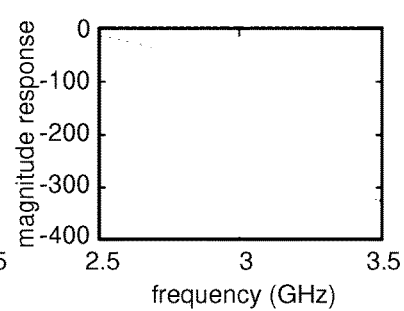 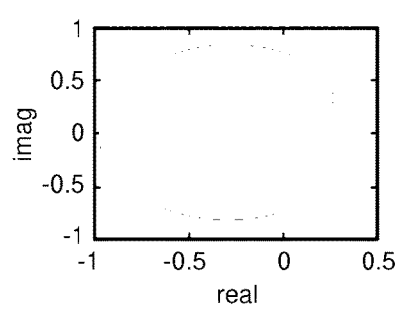
FIG. 28a  FIG. 28b  FIG. 28c

ACTIVE FEEDBACK ANALOG FILTERS WITH COUPLED RESONATORS

TECHNICAL FIELD

This relates to variable analog RF bandwidth filters, and in particular, filters involving coupled resonator with active feedback.

BACKGROUND

Bandpass filters (BPF) are commonly used in signal processing for various purposes. A BPF generally involves some form of resonator that stores energy in a given frequency band. This resonator will have an input coupling and an output coupling. Classical filters for electronic circuit applications are built on this principle. An active form of a bandpass filter typically includes buffers associated with the input and output resonator couplers such that the external coupling does not degrade the frequency selectivity of the resonator.

A BPF with active feedback is essentially that of the super-regenerative amplifier filter that was developed back in the 1930's. Stability of such super-regenerative amplifier filter resonators have always presented the primary problem of stability in the BPF resonator frequency and gain control.

U.S. Pat. No. 10,050,604 B2 (Nielsen et al.) entitled "Variable Filter" (herein the "Nielsen patent"), which is incorporated herein in its entirety, relates to variable, analog filter resonators and points to the use of multiple resonators to create a variety of BPF topologies.

SUMMARY

According to an aspect there is provided a variable filter for an RF circuit, comprising a signal loop comprising first and second signal paths that extend between a signal input port and a signal output port, a plurality of circuit elements connected within the signal loop, the plurality of circuit elements comprising a multi-pole resonator comprising a plurality of frequency tunable resonators, each of the plurality of frequency tunable resonators having a similar resonance frequency, wherein adjacent frequency tunable resonators within the multi-pole resonator are reciprocally coupled, and an adjustable scaling block that applies a gain factor, and a controller connected to tune the multi-pole resonator and to adjust the gain factor of the adjustable scaling block such that the signal loop generates a desired bandpass response.

According to other aspects, the variable filter may comprise one or more of the following features, alone or in combination: at least two frequency tunable resonators may be tuned to different operating frequencies; each frequency tunable resonator may comprise an inductor having an inductance and a capacitor having a capacitance; the controller may tune the multi-pole resonator by tuning the capacitances of the plurality of frequency tunable resonators; the inductances and capacitances may be selected to match input and output port impedances; the plurality of frequency tunable resonators may be connected in a PI (pi-shaped) configuration or a TEE (t-shaped) configuration; and the multi-pole resonator may comprise one or more series resonators and one or more shunt resonators.

According to an aspect, there is provided a method of designing an RF bandpass filter, the method comprising the steps of connecting a plurality of frequency tunable resonators such that adjacent frequency tunable resonators are reciprocally coupled, wherein each frequency tunable resonator comprises an inductor and a capacitor, and connecting the plurality of frequency tunable resonators and an adjustable scaling block that applies a gain factor in a signal loop, the signal loop comprising an input, and output.

According to other aspects, the method of designing an RF bandpass filter may comprise one or more of the following features, alone or in combination: the inductances and capacitances may be selected to provide a desired impedance; the plurality of frequency tunable resonators may be connected in a PI configuration or a TEE configuration; and the multi-pole resonator may comprise one or more series resonator and one or more shunt resonator.

According to an aspect, there is provided a method of controlling a variable filter, comprising the steps of providing a signal loop comprising first and second signal paths that extend between a signal input port and a signal output port, connecting a plurality of circuit elements connected within the signal loop, the plurality of circuit elements comprising a multi-pole resonator comprising a plurality of frequency tunable resonators, each of the plurality of frequency tunable resonators having a similar resonance frequency, wherein adjacent frequency tunable resonators within the multi-pole resonator are reciprocally coupled and an adjustable scaling block that applies a gain factor, and tuning the multi-pole resonator and adjusting the gain factor of the adjustable scaling block such that the signal loop generates a desired bandpass response.

According to other aspects, the method of controlling a variable filter may comprise one or more of the following features, alone or in combination: at least two frequency tunable resonators may be tuned to different operating frequencies; each frequency tunable resonator may comprise an inductor having an inductance and a capacitor having a capacitance; tuning the multi-pole resonator may comprise tuning the capacitances of the plurality of frequency tunable resonators; the inductances and capacitances may be selected to match input port and output port impedances; the plurality of frequency tunable resonators may be connected in a PI configuration or a TEE configuration; and the multi-pole resonator may comprise one or more series resonator and one or more shunt resonator.

According to an aspect, there is provided various topologies for connecting multiple resonators in order to achieve a desired BPF response. The performance of such topologies relates to coupling the various resonators of a multi-resonator topology allowing for resonator interaction rather than resonator isolation. The topologies may be designed to insertion loss and versatility in achievable variable component values, and/or linearity as the Q values of individual resonators may result in reduced gain compression nonlinearity. Multiple adjustable resonators so coupled may be described as multi-pole resonators that have more than one resonator reciprocally coupled. One example of a multi-pole resonator may include three resonators.

According to an aspect, there is provided a method of designing a resonator topology with the objective of realizing a variable filter with reasonably valued components that may be easily tuned, and that may have low insertion loss. Examples of filter topologies may include TEE and PI configurations.

According to some aspects, a multi-pole resonator may have a phase variation with frequency and constant radius over a frequency band centered at the desired Q enhanced band center frequency.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 6b is a detailed view of the plot shown in FIG. 6a.

FIG. 18b is a model of a resonator that includes a varactor diode used to produce the plot in FIG. 18a.

FIG. 27 is a plot of the magnitude response of a two tank multi-pole resonator vs. frequency.

FIG. 28a is a plot of the magnitude response of a two tank multi-pole resonator.

FIG. 28b is a plot of the phase response of a two tank multi-pole resonator.

FIG. 28c is a plot of the resonant Nyquist curve of a two tank multi-pole resonator.

DETAILED DESCRIPTION OF PREFERRED EMBODIMENTS

Figure 1:
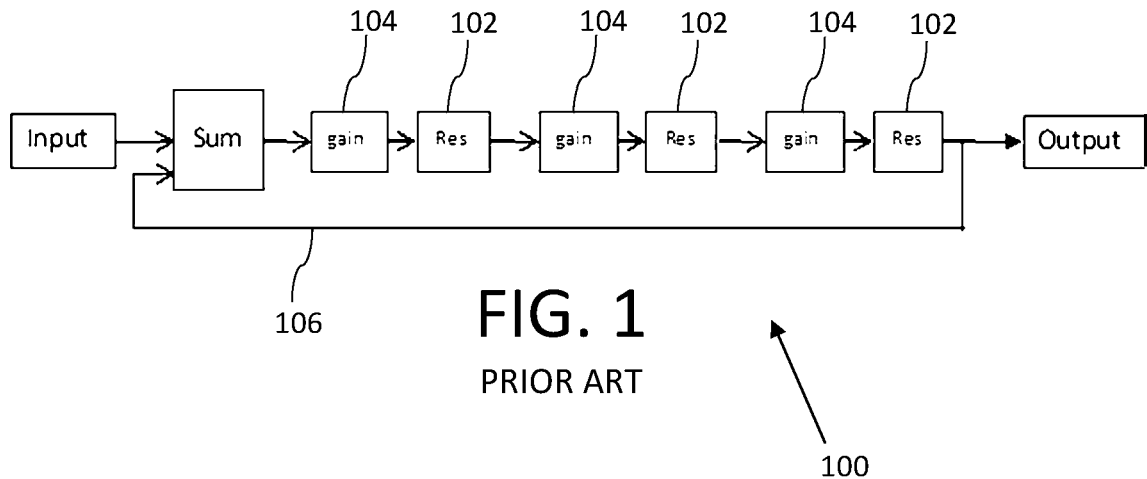
FIG. 1 is a schematic diagram of a cascaded multi-resonator composed of isolated single pole resonators with active gain blocks and a feedback loop.

The discussion below relates to the use of coupled resonator elements of various topologies. As used herein, the term "coupled" is used to refer to components, typically resonators, that are reciprocally coupled, such as directly or by passive circuit elements that allow for bidirectional interaction, rather than coupled via non-reciprocal elements that do not allow for bidirectional interaction, such as buffers or other active circuit elements. Resonators coupled via non-reciprocal elements may be referred to herein as "uncoupled" resonators. Unless specified otherwise, the term "multi-pole resonator" refers to two or more coupled resonators. The term "analog" refers to a continuous time signal, as opposed to a digital, or discrete time signal. The present disclosure is given in the context of an RF signal such as is commonly used in communications, although other contexts that involve similar principles are not excluded. The discussion herein focuses on the s-plane poles of a multi-pole resonator, although zeroes may also be present in the s-plane.

In general, providing a plurality of resonators in a signal loop as part of a filter allows for additional degrees of freedom with respect to tunability and stability. However, this also increases the complexity of the control scheme. The control scheme is simplified by decoupling adjacent resonators, which causes the poles of each resonator to be effectively independent in the open loop response of the filter. On the other hand, when resonators are coupled reciprocally, the resonators are not independent in the open loop response, and the control scheme is further complicated when controlling a multi-pole resonator in a feedback loop, such that an implementable, robust control scheme becomes difficult and complicated. However, by appropriate design of the filter with reciprocally coupled resonators, along with suitable calibration and processing and taking into account the need to coordinate the control of each resonator simultaneously, the filter may be adequately controlled to operate with desired modes.

The resonators used in the multi-pole examples described herein may be LC resonators, commonly called tank resonators, and hence have a capacitance and an inductance that define the resonance frequency of the resonator. The resonators may be tuned by adjusting the capacitance or the inductance, although this disclosure will focus on adjusting capacitance. Other components within the resonator may be maintained at constant values such that only the capacitance is varied. It will be understood that other tunable resonators may be used, along with other adjustable circuit elements other than capacitors. Within a multi-pole filter with coupled and tunable resonators, each resonator may be designed to have a similar resonance frequency, or resonance frequencies that produce one or more modes that are useful when the filter is in operation when adjacent tunable resonators within the multi-pole filter are reciprocally coupled.

FIG. 1 depicts a cascaded, uncoupled multi-pole filter 100 composed of isolated, single pole resonators 102 within a feedback loop 106 and separated by active gain blocks 104. This known filter 100 is easily implemented but can may have a high loss and requires buffers between adjacent resonators 102. The concept is that the insertion loss of a single resonator 102 can be offset by a gain block 104 preceding or following it.

Typical resonators that are not matched to the input and output port impedance may have high insertion loss. The insertion loss may be compounded with several resonators in series. When a large number of multiple buffer-isolated resonators are used in a filter topology, the insertion loss may be too high. The high insertion loss may exacerbate the trade-off issue of linearity, noise, and power consumption of the multi-pole resonators with a large number of resonators. When the loss of the resonator is high, the power output of the gain block may have to be increased to accommodate the input signal power, the much larger feedback signal power, and loss of the resonator. In these conditions, the gain block linearity specifications may become impractical. The input signal power may be reduced to reduce the gain block linearity requirements, or the order of the gain block and resonator may be changed. However, this may negatively impact the noise figure.

One may consider implementing reciprocally coupling capacitors between adjacent frequency tunable resonators, rather than buffers, but these capacitors would be of such low value that the resonator coupling losses become excessive. Additionally, if the coupling capacitance is small, then the coupling between the resonators is "loose" such that the resonance frequencies of the coupled resonator structure is essentially that of the individual resonators. This results in a higher resonator tank Q, but with high insertion loss. If the coupling is made "tight" by increasing the coupling capacitor, then the modes couple to the point that the resonance frequencies are not the same. This makes the Nyquist contour not of constant radius, and tuning becomes difficult. If the coupling is increased further, then eventually one dominant resonance would emerge that is at the same frequency as the individual resonator as the L is essentially ⅓ and C is increased by a factor of 3. However, this does not help as we now essentially have a single resonator but at a higher Q. The higher Q is due to the ratio of $\sqrt{(L/C)} \Rightarrow \sqrt{((L/3)/(3C))}$ is ⅓ of what it was before, which implies the effect of the relative loading of the combined resonator is less.

Figure 2:
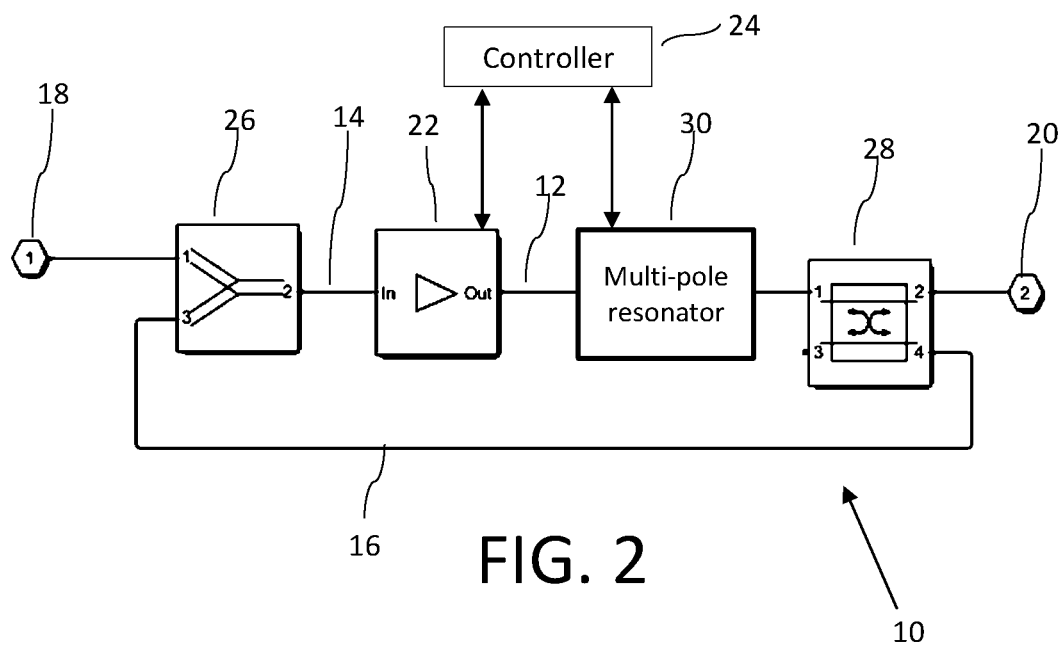
FIG. 2 is a schematic diagram of a variable filter with a multi-pole resonator.

Referring to FIG. 2, a variable filter, generally identified by reference numeral 10, is shown. Variable filter 10 is designed to be used in an RF circuit, having a signal loop 12 with a first signal path 14 and a second signal path 16 that extend between a signal input port 18 and a signal output port 20. Connected within signal loop 12 are a plurality of circuit elements that may be located in either of the first signal path 14 or the second signal path 16. The plurality of circuit elements includes an adjustable scaling block 22 that applies a gain factor, and a multi-pole resonator 30. Multi-pole resonator 30 incorporates a plurality of resonator filter elements, as will be discussed in more detail below to achieve the desired filter characteristics. In any given implementation, variable filter 10 may also include other circuit elements as necessary, examples of which include a sum block 26 or a coupler 28 in the depicted example. Also included with variable filter 10 is a controller 24 to regulate the multi-pole resonator 30 and to adjust a gain factor of adjustable scaling block 22 such that a desired bandpass response may be generated between signal input port 18 and signal output port 20.

Figure 3:
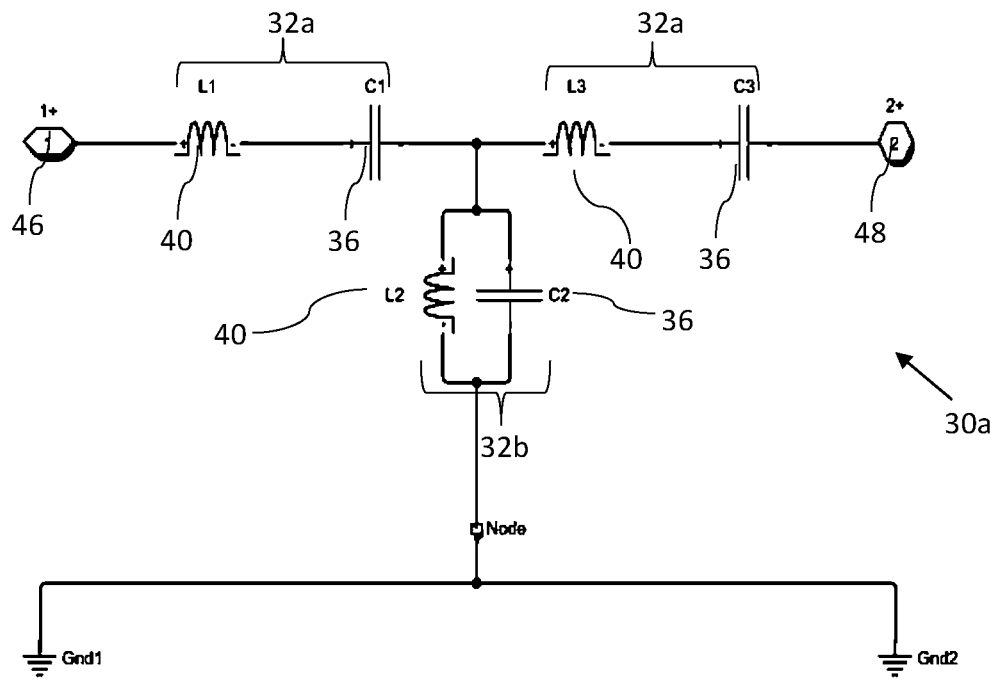
FIG. 3 is a diagram of multiple resonators coupled in a TEE architecture.
Figure 4:
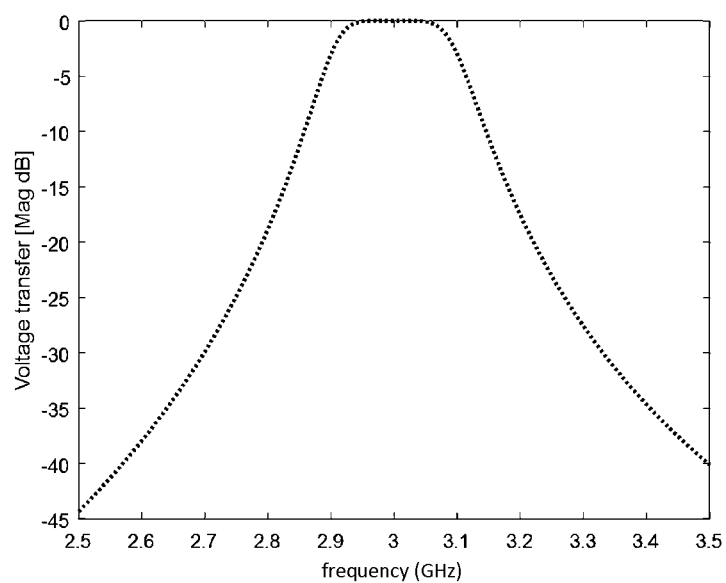
FIG. 4. is a plot of the frequency response of a maximally flat passband filter topology that provides a constant Nyquist radius response that promotes stability.

Variable Bandpass Filter Implementation Based Upon a Coupled Resonator Network TEE Topology Referring to FIG. 3, multi-pole resonator 30a may be a TEE multi-pole resonator. The frequency response of this TEE multi-pole resonator, for a design centered at 3 GHz, is shown in FIG. 4, with a maximally flat passband which may be suitable for avoiding certain types of instability, because the flat passband provides a constant radius Nyquist response within the operating range which promotes stability.

Figure 5A:
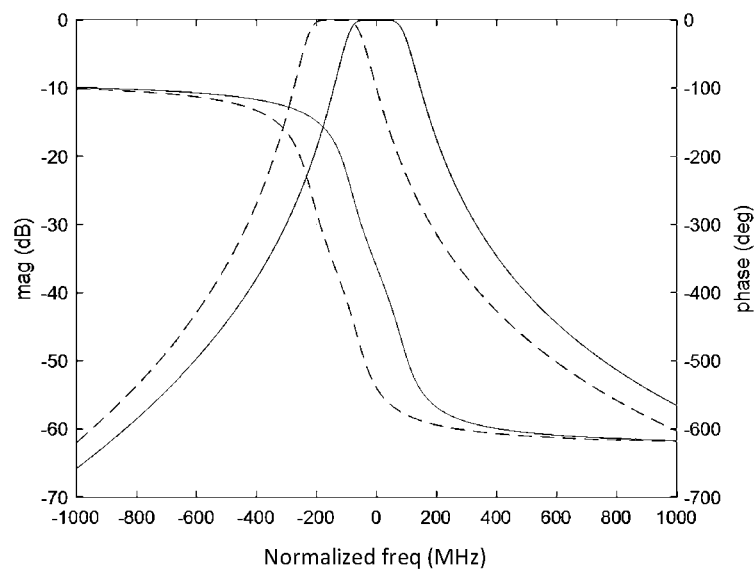
FIG. 5a is a plot comparing the normalized frequency response of the maximally flat passband TEE resonator centered at 3 GHz with the capacitors at a nominal value and increased by 10%.
Figure 5B:
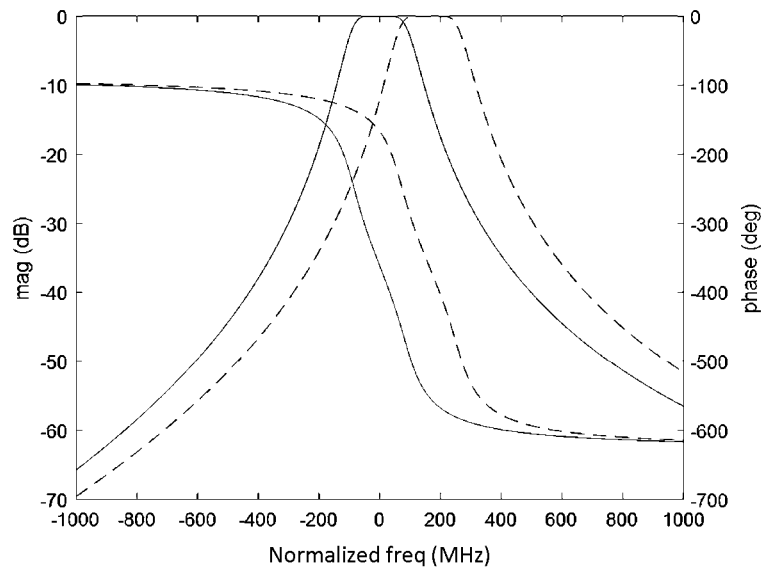
FIG. 5b is a plot comparing the normalized frequency response of the maximally flat passband TEE resonator centered at 3 GHz with the capacitors at a nominal value and decreased by 10%.

When the three capacitors 36, which may include varactors, of the TEE multi-pole resonator 30a are increased proportionally by +10% and −10%, we get the frequency responses shown FIG. 5a and FIG. 5b, respectively. The dashed lines indicate the ±10% detuning and the solid lines are the original tuning centered at 3 GHz.

Note that to a first order, the filter shape is invariant to the change in capacitance even though the filter will have a change in impedance as the capacitance is increased.

Figure 6A:
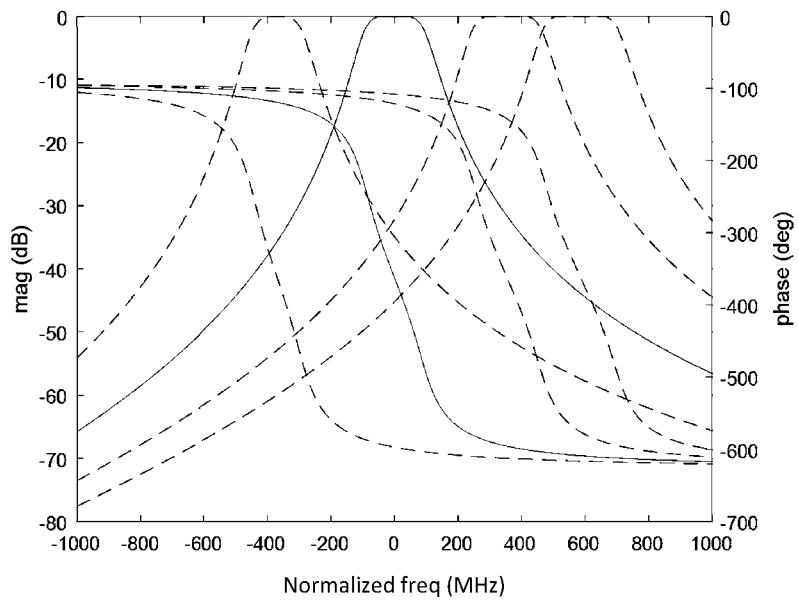
FIG. 6a is a plot comparing the normalized frequency response of the maximally flat passband TEE resonator centered at 3 GHz with the capacitors at different values.
Figure 6B:
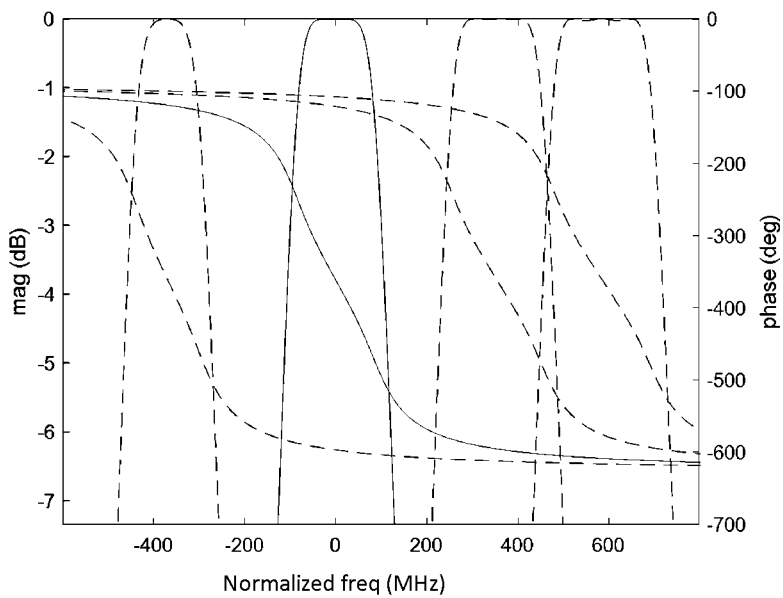

Pushing the variation of capacitors 36 further, we start from 70% and go to 130% as seen in the plot of FIG. 6a, with FIG. 6b showing a zoomed in version of the plot of FIG. 6a. If we consider a constant phase shift of the TEE resonator 30a in the vicinity of 300 degrees (the remaining closed loop of the signal loop 12 providing the remaining 60 degrees, as an example), then the frequency tuning of the Q enhancement may extend up to about an 800 MHz range which is substantial in terms of the relative frequency tuning. Note that the passband shape of TEE multi-pole resonator 30a is still maximally flat throughout but becomes a narrower band for the lower frequency and a broader band for the higher frequency.

For broadband tuning≥20%, the maximally flat passband TEE multi-pole resonator 30a as shown has a pair of series resonators 32a that need a very high $\sqrt{L/C}$ and the shunt resonator 32b that needs a very low $\sqrt{L/C}$. With this the ratio of the components in the series and shunt sections vary by 1000:1 which may be unworkable.

A variety of TEE network implementations, with isolated resonators, have been investigated, all of which result in one or more challenging design solutions for tuning range and stability when the number of resonator elements is increased to provide increased bandwidth while retaining maximal flatness in the passband.

Figure 7:
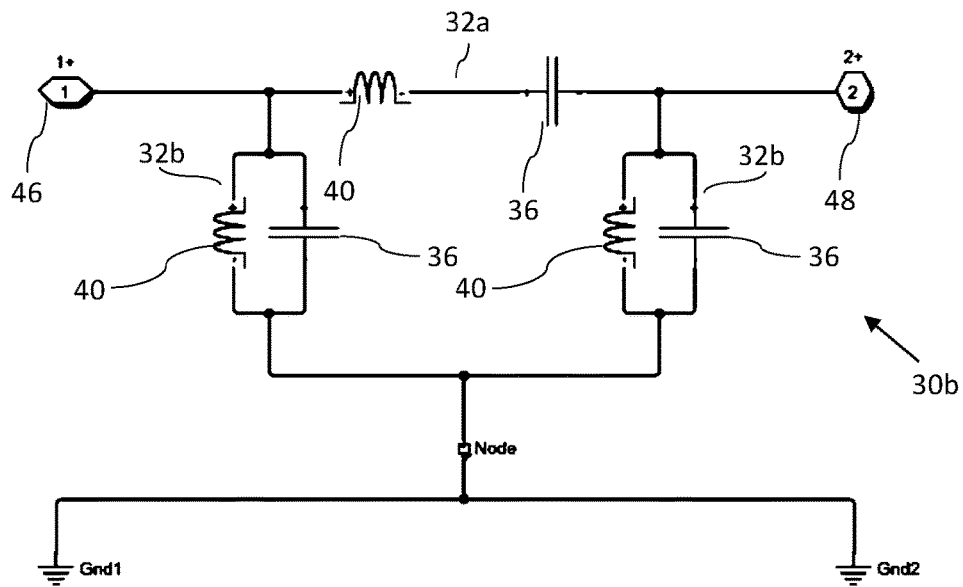
FIG. 7 is a schematic diagram of a PI network of a triple pole multi-resonator circuit with two parallel and one series section.
Figure 8:
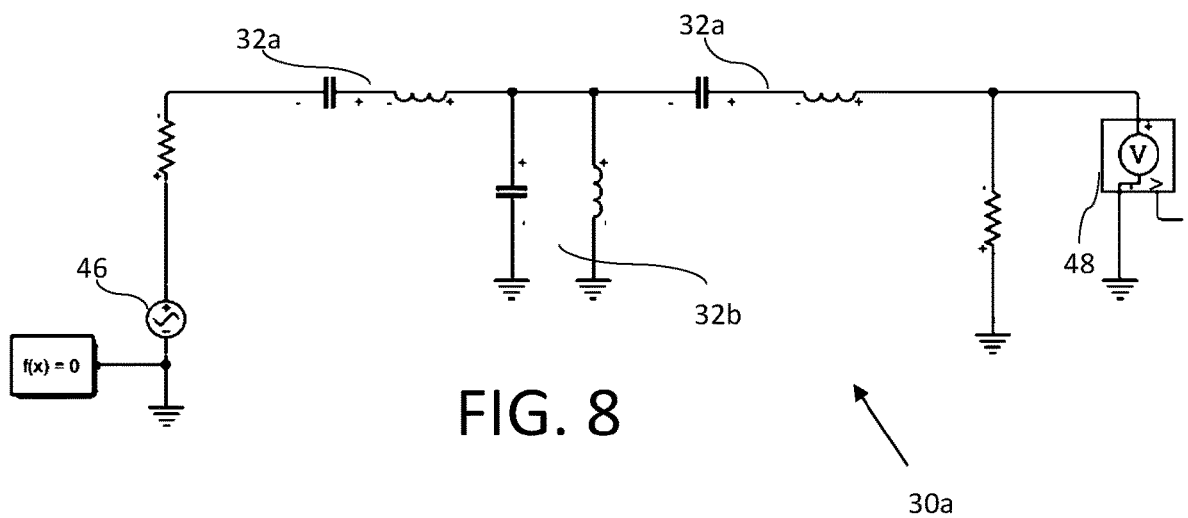
FIG. 8 is a schematic diagram of a TEE network of a triple pole multi-resonator circuit with two series and one parallel section.
Figures 9, 10:
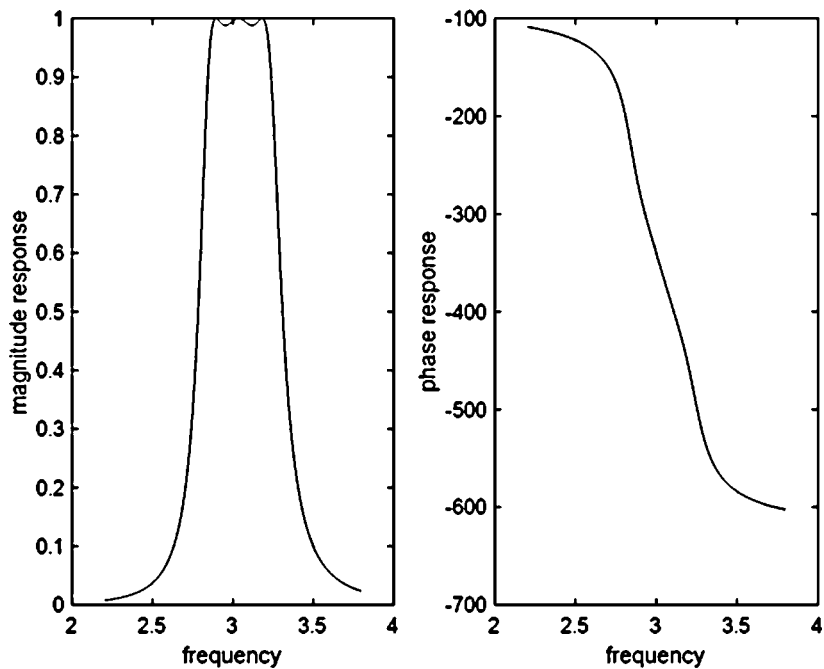
FIG. 9 is a plot showing the magnitude response of the triple resonator shown in FIG. 8.
FIG. 10 is a plot showing the phase response of the triple resonator shown in FIG. 8.

Variable Bandpass Filter Implementation Based upon a Coupled Resonator Network PI Topology An alternate of the TEE multi-pole resonator 30a topology, discussed in the previous section, is the PI multi-pole resonator 30b shown in FIG. 7. Example passband characteristics of PI multi-pole resonator 30b for an equal-ripple passband response are shown in FIG. 9 and FIG. 10. If the characteristic impedance is reduced very slightly then the equal ripple response can be morphed into a maximally flat passband characteristic.

For the conventional maximally flat passband or equal ripple passband filter implementation using, for example, coupled resonators 32a and 32b of FIG. 3, we start with a set of pole locations that are based on calculations from which the L and C resonator tank values are determined. In one example with three resonators 32a, 32b, resonators 32a, 32b are initialized with the same L and C values and then set an allowed ratio of the L and C values for each resonator 32a, 32b based on implementation constraints. Then adjust the characteristic reference resistance of the variable filter 30a to get the desired amount of passband ripple. One example may be summarized in the following four steps:

1. The three resonators 32a, 32b all have the same resonance frequency of $\Omega = 1/\sqrt{LC}$
2. Select an fseries factor. This is the ratio of {L,C} values of series resonators 32a to the corresponding {L,C} values of the shunt resonator 32b. For implementation, the fseries may preferably be between 10 to 20. A larger fseries results in a narrower passband of the overall resonator, but the implementation may become more difficult. Making fseries smaller couples the three resonators more and the bandwidth increases.
3. Now select the characteristic reference resistance (Z), such that the L and C components can be accommodated. That is, if Z is increased, then the values of capacitors 36 are decreased, and the values of inductors 40 are increased. Note that Z is the output impedance of a driving stage 46 into multi-pole resonator 30 and the impedance of a load 48 attached after multi-pole resonator 30. The objective is to get a set of {Z,L,C, fseries} such that the component values are compatible with circuit or chip realization.
4. Z has another effect in that it sets the ripple of the passband. Ideally the ripple should be very small as this allows for high Q enhancement without incurrence of instability.

Lowering the value of Z for the PI network multi-pole resonator 30b of FIG. 7 lowers the passband ripple. However, it also lowers the effective Q of the resonator 30b implying that the Q enhancement has to be higher.

Conversely, increasing Z, increases the effective Q of the resonator 30b but then increases the passband ripple. As stated, passband ripple limits the amount of Q enhancement possible without instability.

Figures 11A, 11B:
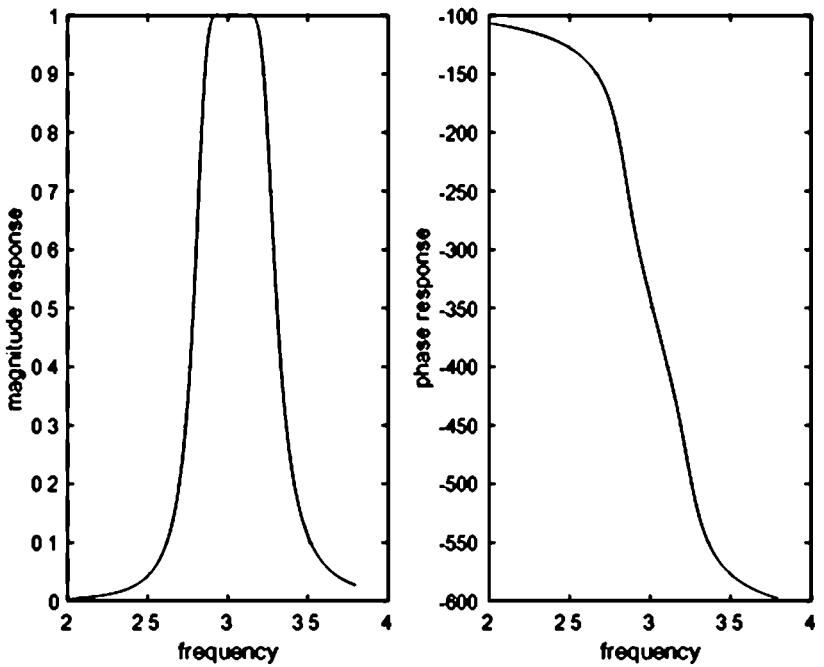
FIG. 11a is a plot showing the magnitude response of a triple resonator with an improved characteristic impedance and resulting maximally flat passband response.
FIG. 11b is a plot showing the phase response of a triple resonator with an improved characteristic impedance.

FIGS. 9 and 10 depict a typical response of a PI multi-pole resonator 30b of FIG. 7 tuned in this manner with a small passband ripple. For this example, ripple at this level will allow for a Q enhancement of up to about 100 which may be adequate for applications of variable filter 10 of FIG. 2 and FIG. 13. If the characteristic impedance is reduced slightly such that the resonator Q is reduced, then the maximally flat passband response as in FIG. 11a and FIG. 11b is achieved.

It should be noted that the same procedure can be followed for tuning of the TEE multi-pole resonator 30a of FIG. 3. A difference is that if Z is lowered then the effective Q of the resonators increases instead of decreasing as for the PI.

For tuning of the coupled TEE multi-pole resonator 30a (shown in FIG. 3), the three capacitors 36 are varied in the same proportion. As the frequency of the tank resonators are $1/\sqrt{LC}$, it is clear that the frequency tuning varies as $1/\sqrt{C}$ as usual.

The method herein addresses this component realization issue by presenting an implementable topology that allows a broadening of the bandwidth and some passband ripple to enable the smaller component value spread of the Butterworth filter, while maintaining a low insertion loss. With the low insertion loss comes desirable linearity and stability properties of the closed loop Q enhanced analog filter.

Figure 12:
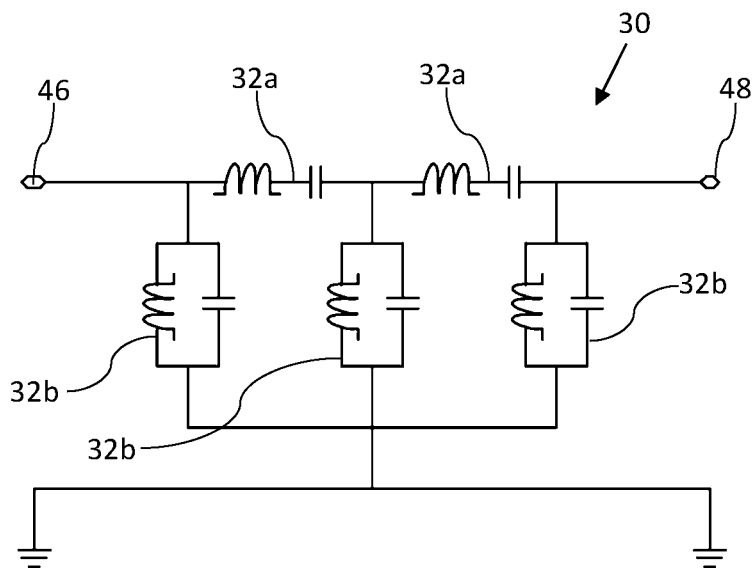
FIG. 12 is a schematic diagram of a PI network of a $5^{th}$ order filter.

The number of LC resonators 32a and/or 32b in a multi-pole resonator may be increased. The benefit of the added complexity of the additional poles is that the passband of the multi-pole resonator 30 can be increased. An example of a $5^{th}$ order filter is shown in FIG. 12 with series and parallel resonators 32a and 32b. However, for a constant bandwidth the spread in component values increases and if the bandwidth is increased too far then spurious filter bands will emerge. Hence, to reduce complexity, multi-pole resonator implementations may generally be limited to 2 or 3 poles.

Also, it is recognized that we can transition from a maximally flat passband to an equal ripple passband design by changing inductor 40 and capacitors 36 components of FIG. 3 slightly.

Component Selection Methodology for Coupled Resonator Topologies

Figure 13:
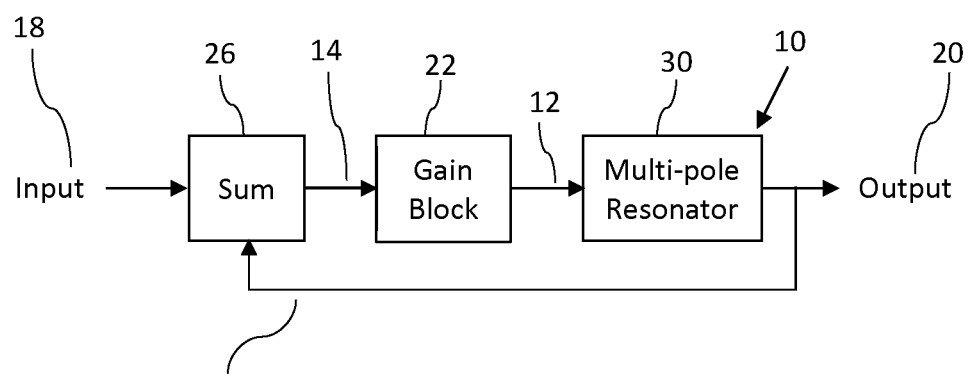
FIG. 13 is a schematic diagram of a variable filter with a summing block, a gain block, and a multi-pole resonator.

In a typical embodiment, signal loop 12 of variable filter 10 shown in FIG. 2 includes a gain block 22 with a complex gain that may include a phase shift. Hence a signal loop 12 is shown in FIG. 13. This signal loop 12 structure is denoted, again, as having a multi-pole resonator 30.

The order of the gain block 22 and multi-pole resonator 30 block may be of significance if the loss through multi-pole resonator 30 is more than one dB or so. From a system noise performance perspective, it is better to have gain block 22 with a low noise figure preceding the lossy multi-pole resonator 30. However, it is possible to create a multi-pole resonator 30 of very low loss, and hence multi-pole resonator 30 may be placed ahead of gain block 22 as in FIG. 14.

This ordering has the advantage that multi-pole resonator 30 will suppress large out of band interference signals prior to reaching gain block 22 which may improve overall linearity.

Figure 14:
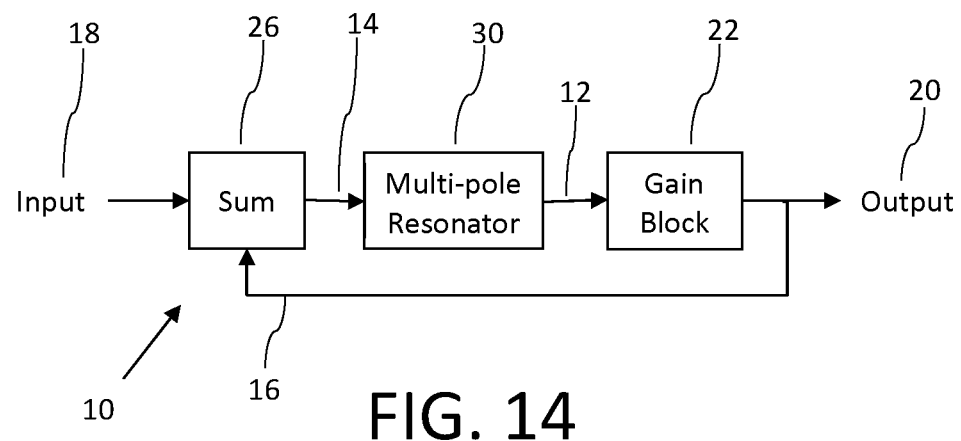
FIG. 14 is a schematic diagram of a variation of a variable filter with a multi-pole resonator.
Figure 15:
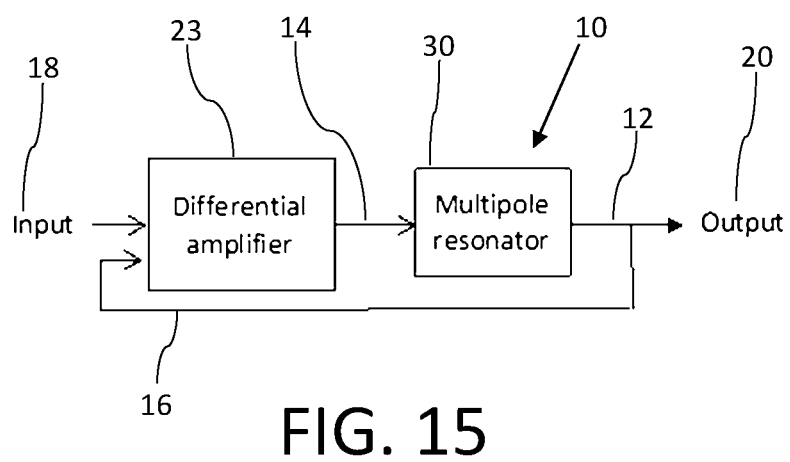
FIG. 15 is a schematic diagram of a variable filter with a differential amplifier.

In another embodiment, sum block 26 and the gain block 22 of FIG. 14 can be combined into a differential amplifier 23 as shown in FIG. 15. Now the potential loss of sum block 26 is essentially offset by the increase in the noise figure (NF) of the differential gain block as the two functions are integrated as shown in FIG. 15. The signal output port 20 may not be critical and may be an ancillary output of differential amplifier 23.

Figure 16:
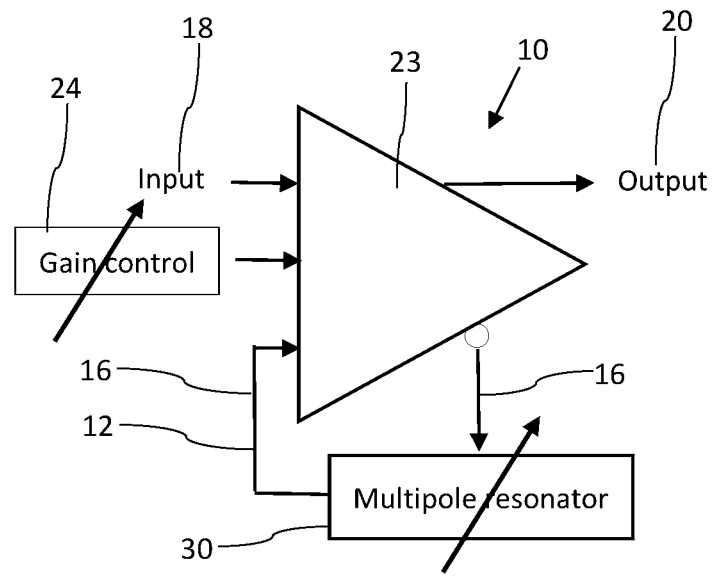
FIG. 16 is a schematic diagram of a variation of a variable filter with a differential amplifier.

Referring to FIG. 16, a variable filter 10 with differential amplifier 23 with two outputs for zero and 180 degrees is shown. It is the same variable filter 10 circuit of FIG. 15, but emphasizes differential amplifier 23 as a central element. Regardless of the details of multi-pole resonator 30 and gain block 22 ordering, it is noted that variable filter 10 consists of three functional blocks seen in FIG. 14: sum block 26, gain block 22, and multi-pole resonator 30. To make variable filter 10 tunable over a range of frequencies, differential amplifier 23 and multi-pole resonator 30 are each made tunable. Implied is that the pole of multi-pole resonator 30 can be tuned in frequency as shown. Additionally, the gain of differential amplifier 23 can be adjusted to control the feedback signal that controls the Q enhancement.

The objective here is to depict the multi-pole resonator as having a plurality of poles. Hence, we have a multi-pole resonator 30 consisting of multiple LC resonator tanks, or multi-pole resonators. The desired performance of the variable filter will establish the number of poles required in multi-pole resonator.

Figure 19:
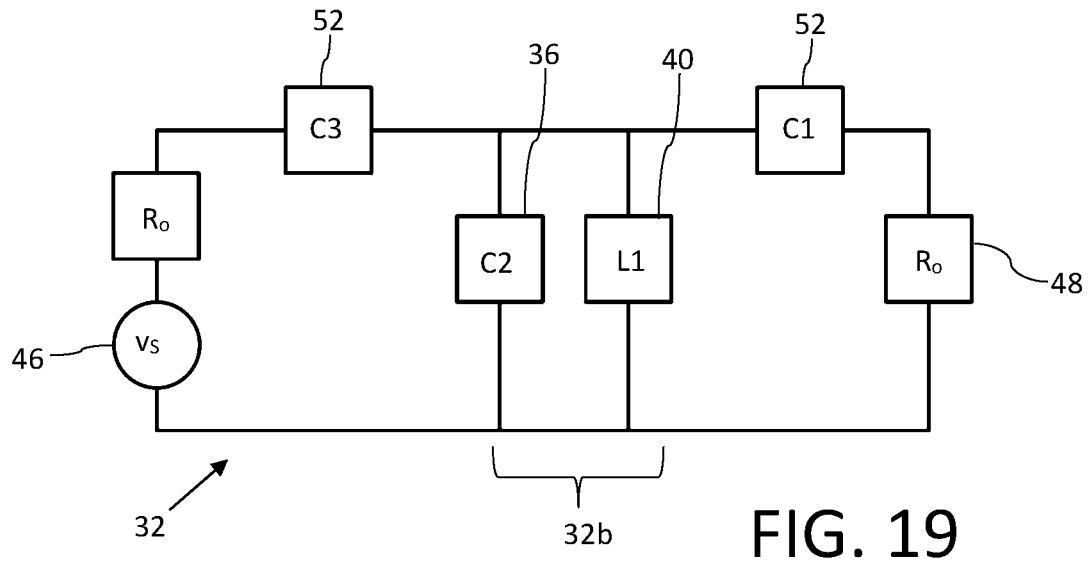
FIG. 19 is a schematic diagram of a low loss implementation of a single tank LC resonator using coupling capacitors.

Referring to FIG. 19, a circuit with a single resonator tank 32b and coupling capacitors 52 is depicted. The circuit may be made variable, for example, using electronic control of varactor 54 or by using micro-electromechanical (MEMS) elements. MEMS inductors and capacitors rely on mechanical movement of conductors on the chip surface. However, control is slow as it is based on conductor movement by bimetal bending with heating control currents. The response time is slow and defeats much of the advantage of other variable filters. Hence, MEMS elements will not be considered further, although for applications that do not require fast response time, MEMS elements may be used.

Electronic Control Mechanisms

Figure 17:
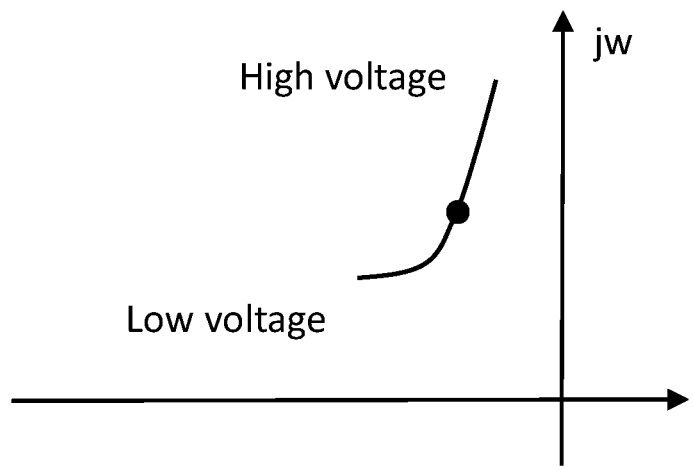
FIG. 17 depicts an example of the tuning of the pole of an LC tank resonator with a controllable varactor.

In general, referring to FIGS. 3 and 7, it is preferable to tune multi-pole resonators 30a, 30b by tuning the capacitors 36 in the series and parallel tank resonators 32a and 32b, where the other components remain constant. Typically, this will be implemented using electronic control mechanisms. Such control mechanisms may include, but are not limited to, the following electronic control mechanisms:

Type 1 control: Biasing a semiconductor junction depletion region changing the junction capacitance Type 2 control: Injection of minority or majority carriers into semiconductor channels changing conductivity Type 3 control: Add or remove charge from an insulated electrode that changes electric field intensity in a nearby channel The first resonator control option is a varactor diode, which is of primary interest in controlling the resonance frequency of an LC tank. The change of the resonator pole by controlling varactor would be as in FIG. 17.

At low bias voltage, C is larger while Q is less, as the varactor capacitance is larger, but the loss is also higher due to carrier diffusion conductivity in the varactor junction. At higher voltage, the capacitance decreases, and the Q is higher as there is less conductivity across the junction.

Figure 18A:
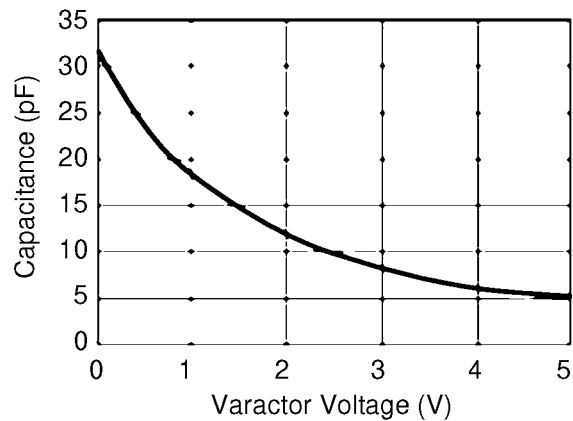
FIG. 18a is a plot of capacitance vs. voltage for a typical varactor diode.
Figure 18B:
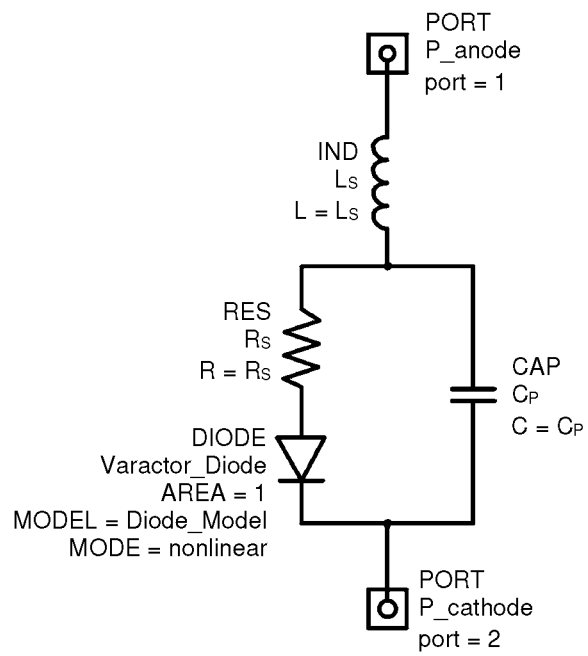

An example is an SM1705 diode that is useful up to about 1 GHz shown in FIGS. 18a and 18b. A varactor-controlled LC tank may be used to provide the required tuning for a multi-pole resonator. However, the effect of larger signals is also clear as the bias voltage and signal voltage across the varactor cannot be separated. A large signal will result in a combination of AM-AM and AM-PM modulation. Furthermore, as the capacitance is modulated by the signal and that the capacitance-voltage curve is convex, the average capacitance will increase.

Type 2 and Type 3 controls primarily result in conductance changes. The resistance of the channel is modulated depending on the density of carriers. But this is more to move the pole horizontally in the s plane. Otherwise, the carrier modulated channel can operate as a switch that can switch a fixed value reactive component in or out.

The embodiments described herein will be based on varactor control of the tank resonance frequency. The issue of the varactor AM-PM distortion will be of significance in terms of stability of the feedback circuit. Ensuring stability at moderate levels of Q enhancement is a key driver towards using multiple resonator tanks as will be described.

Low Loss Circuit Implementation of Multi-Pole Resonator Topology

A potential problem with both the TEE and PI multi-resonator networks 30a and 30b of FIG. 3 and FIG. 7 is that the spread of the component values for a true maximally flat passband or equal ripple passband may be large, which may make the circuit difficult to realize in either a surface mount or a chip integration. For a system requirement of higher Q with low loss linear filtering, this component realization issue can become insurmountable. We will show that for an approximate maximally flat passband or Equal ripple passband filter with uncoupled resonators, moderate component spread results, while with a coupled resonator maximally flat passband or equal ripple passband configuration the component spread is small.

Low Loss Single Resonator Circuit

The general circuit implementation of a single resonator is shown in FIG. 19 with an LC tank 32b consisting of tank inductor 40 and tank capacitor 36, coupling capacitors 52, and both source 46 and load 48 impedance is Ro. In general, source 46 and load 48 impedance may be different and still maintain lossless transfer at resonance between the source and the load.

The iterative design of the resonator is as follows:
Step 1. The desired frequency establishes the product of tank capacitor 36 and tank inductor 40. These components are chosen in the range of a couple of pF and nH depending on the circuit realization, whether it is chip integration, surface mount or thick/thin film.

Step 2. The coupling capacitors 52 are first selected to be large, on the order of 20 pF.

Step 3. Then the circuit response is calculated with the first objective of getting the center frequency approximately correct.

Step 4. Then the coupling capacitors 52 are reduced which increases the Q. Basically, decreasing coupling capacitors 52 or tank inductor 40 increases Q and then tank capacitor 36 is increased to maintain the resonance frequency.

Step 5. Also, if the source 46 and load 48 impedance are the same then the capacitance of coupling capacitors 52 is the same.

Figure 20A:
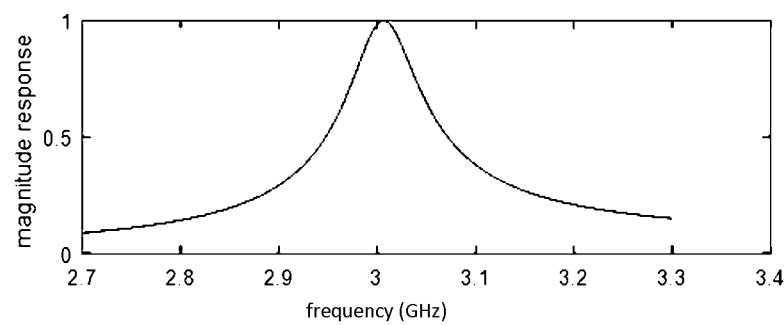
FIG. 20a is an example plot of a magnitude response of a transfer function of a low loss single resonator network.
Figure 20B:
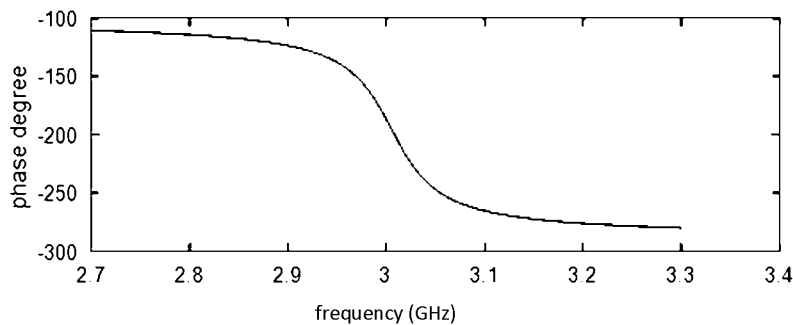
FIG. 20b is an example plot of a phase response of a transfer function of a low loss single resonator network.

An example transfer function is shown in FIG. 20*a* and FIG. 20*b*. The way it works may be shown on a Smith chart. Referring to FIG. 19 consider the input impedance as seen from the source 46. Coupling capacitor 52 is a series capacitor and the LC tank 32*b* of the single resonator runs slightly low in frequency by about 10%

$$\left(\text{that is } \frac{1}{2\pi\sqrt{L1\,C2}} = 3.27 \text{ GHz}\right).$$

Therefore, the tank 32*b* is equivalent to a shunt inductor. We can see from a Smith chart that such an arrangement can bring the source 46 impedance back to Ro resulting in lossless transmission at resonance. Also, the impedance of where it crosses the real axis of the reflection coefficient can be at a much higher resistance. Hence, the smaller the capacitance of coupling capacitors 52, the higher the load resistance will be seen from the tank 32*b* and hence the higher the Q will be.

Single Resonator Nyquist Curve

Figure 21:
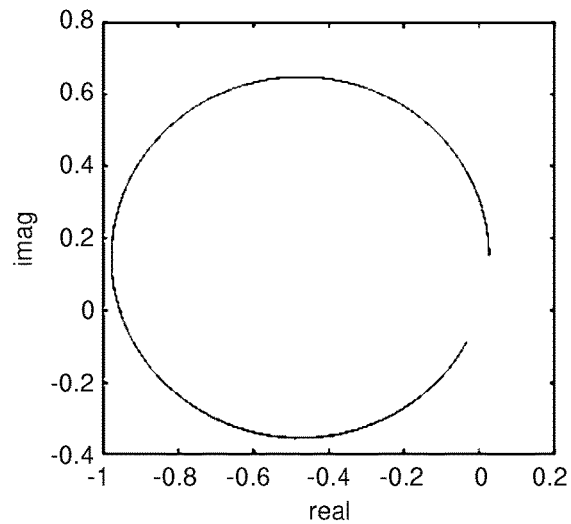
FIG. 21 is a Nyquist plot of a single pole resonator.

The single resonator Nyquist curve (RNC) shown in FIG. 21 for the circuit shown in FIG. 19 indicates that a 180-degree phase shift is required to make the phase shift around the loop of 360 degrees at resonance. By slightly detuning resonator 32*b* this phase matching condition may be met, keeping in mind that a condition of stability is to ensure the operating point remains outside the RNC.

With respect to FIGS. 19 and 21, another observation is that the Nyquist shape is invariant to changes to the tank frequency. That is, as the tank capacitor 36 is increased or decreased then the frequency will warp around the Nyquist curve but the shape stays constant. This is of significance in that when the soft saturation of the varactor sets in with a larger signal amplitude then the capacitance of the tank 32*b* can increase but this just results in a warping of frequency and not an instability. The slight slope of the RNC at the intersection point represents the detuning of the resonator.

This can cause instability if the whole RNC rotates CCW. However, this cannot happen as the varactor diode capacitance increases with increased signal level. Also, the RNC shape is invariant to first-order changes in capacitance.

Single Resonator Stability

It should be stated that the invariance of the single resonator 32*b* Nyquist curve with changes in capacitance is only a first-order approximation, but this is sufficient to avoid instability for moderately high Q enhancement. The shape of the RNC would remain perfectly invariant to changes in capacitance if Ro was also changed. However, as the ratio of $\sqrt{L/C}$ changes then there is a mismatch such that the radius of the RNC would (in a second-order sense) decrease with an increase in capacitance. However, this will cause the throughput gain to decrease slightly, implying a stable operating point.

Figure 22:
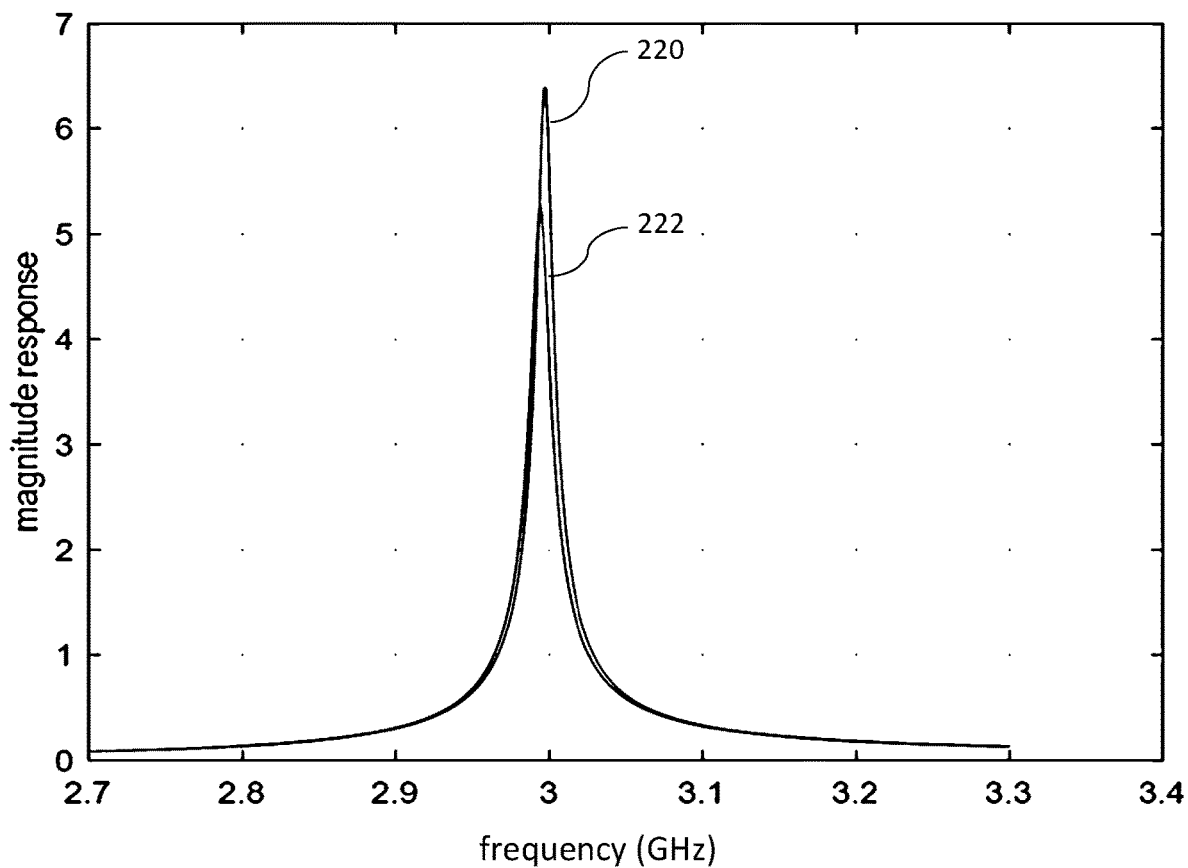
FIG. 22 is plot of the magnitude response of the single pole resonator showing the closed loop Q enhanced response with G=0.9 and an additional phase lag.

A gain G=1 is the onset of instability, when the operating point crosses the RNC. FIG. 22 shows the Q enhancement with a high gain G=0.9, without a phase lag (line 220) and with a phase lag (line 222) of about 5 degrees, which can occur in a soft saturation case of the gain block. Note that the phase shift causes the closed loop gain to drop as expected from the RNC in FIG. 18, mitigating gain compression.

Figure 23:
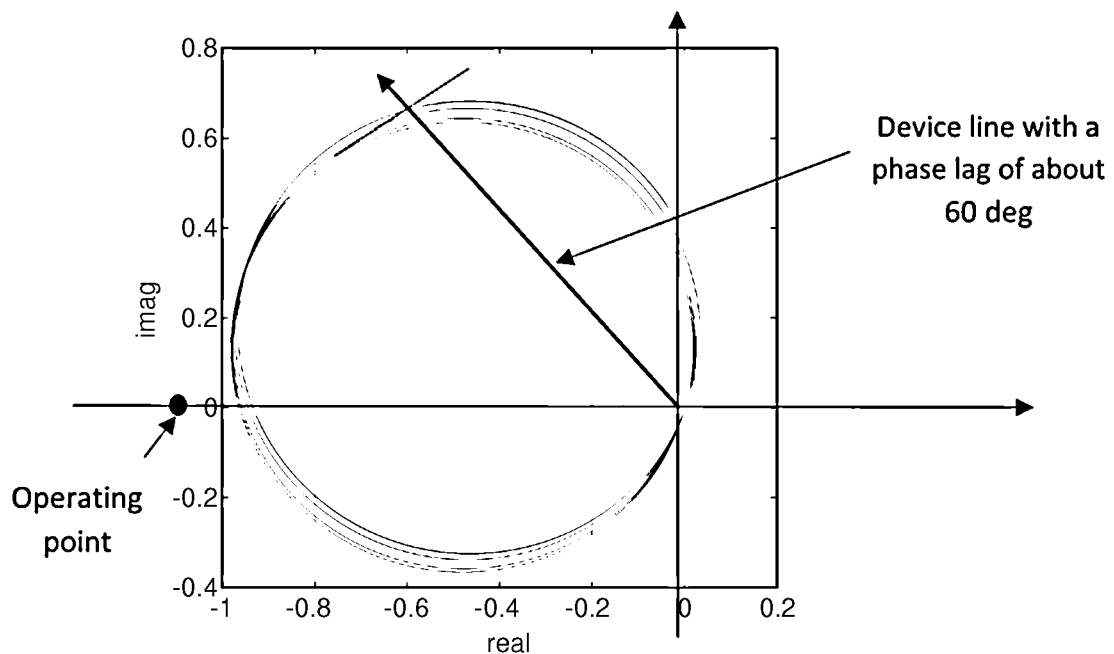
FIG. 23 is a plot of a resonator Nyquist curve of a resonator with the capacitance varied from 60% to 140% of the value required for a 3 GHz center frequency.

FIG. 23 shows the RNC changing very slightly as the tank capacitor 36 is varied from 60% to 140% of its designed value from the previous plot, while the coupling capacitors 52 remain fixed. This capacitance change results in a resonant frequency change of about 20%. Note that RNC invariance is only strictly valid for the case of all the capacitors 52 and Ro being changed simultaneously.

Type II instability can potentially occur if the phase lag exceeds about 60 degrees as shown in FIG. 20 with the modified device line (rotated with −60 degrees relative to the negative real axis). Note that the slope of the RNC at the intersection is such that at high Q enhancement, a clockwise rotation of the RNC would result in instability.

However, here is where the shape invariance of the RNC is significant. To cause an instability will require a negative phase shift of the gain block. However, the soft saturation of a gain block is typically a negative phase shift together with a decrease in gain. Hence such a possibility of instability can readily be designed out.

Figure 24:
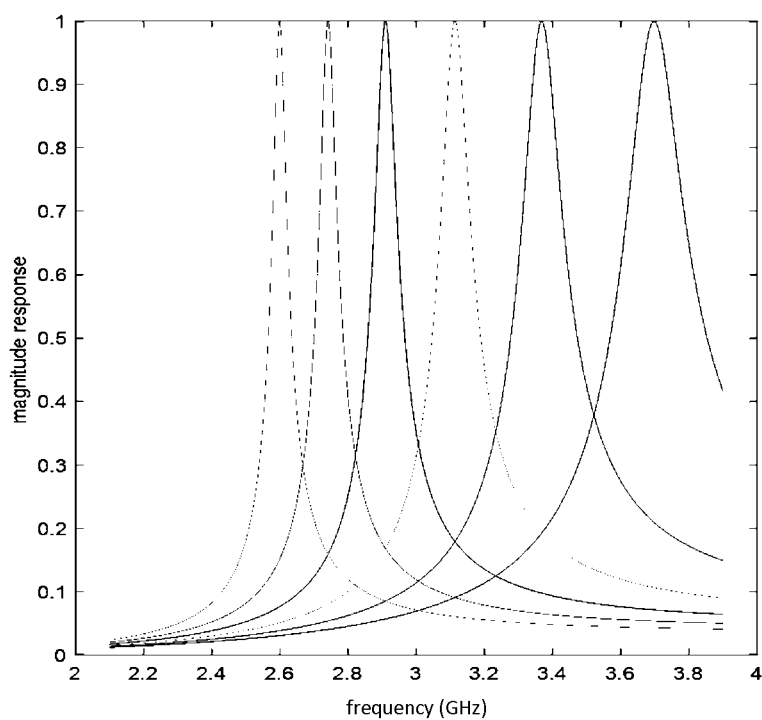
FIG. 24 is a plot of the magnitude response of a resonator with the capacitance varied from 60% to 140% of the value required for a 3 GHz center frequency.
Figure 25:
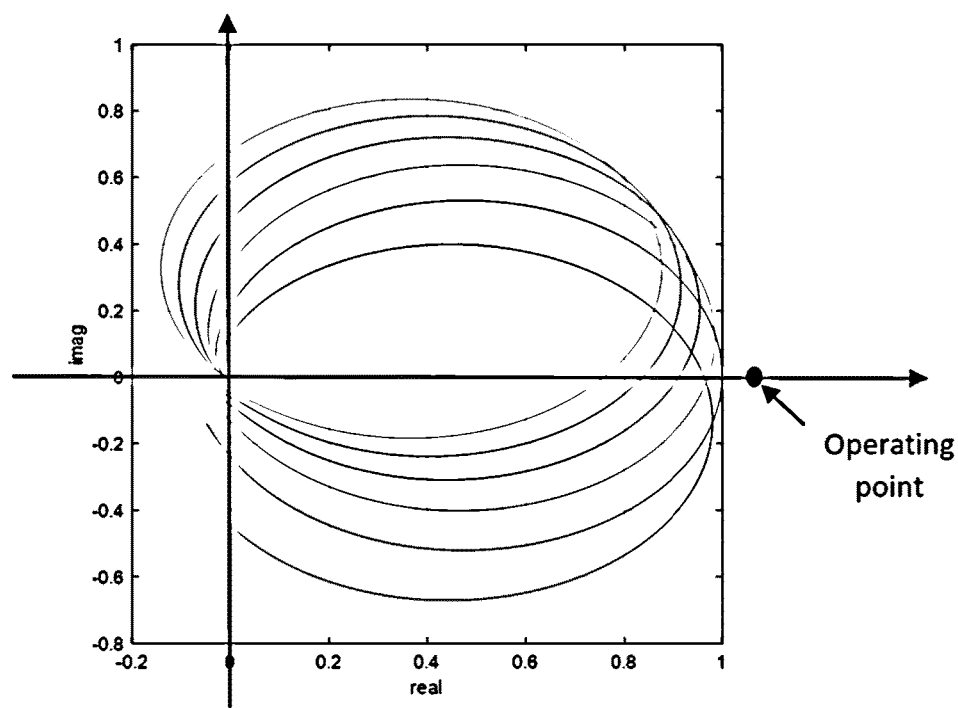
FIG. 25 is a resonator Nyquist curve of the resonator of FIG. 19 with the capacitance varied from 60% to 140% of the value required for a 3 GHz center frequency with a delay of 0.13 ns added to the loop.

The resonator magnitude plot is shown in FIG. 24 with the capacitance of tank capacitor 36 varied from 60% to 140% of value required for a 3 GHz center frequency. Note that the Q is increased for lower frequencies as the coupling is less. Hence there is a slight coupling of the Q and frequency tuning such that the two controls are not completely uncoupled. This may be compensated for with a cross coupling term added to the LUT that is populated based on initial calibration processes.

There is a potential instability if there is delay or a frequency dependent phase shifting network added to the loop. To avoid having to consider a wide range of possibilities, we will limit the discussion here to the pure delay.

Consider the RNC with a 0.13 nsec delay added to the first-order filter of FIG. 19 as shown in FIG. 24. The different RNC curves correspond to the different tuning frequencies of FIG. 23. Note that the intersection with the real axis device line is not orthogonal but sloped in either way from orthogonal depending on the tuning. In soft saturation, the varactor capacitance would increase and the RNC would shift to a tuning curve of higher capacitance (lower resonance frequency) as represented by the curves in FIG. 23. Based on this, the higher frequency tuning curve would become unstable at higher levels of Q enhancement.

In summary:

The single resonator 32*b* shown in FIG. 19 may be implemented to have low loss at resonance. It is practical as there is only a single capacitor to tune, namely tank capacitor 36.

The coupling capacitors 52 may be varactors, but these generally affect the overall Q of the resonator 32*b* and do not have much effect on the shape of the RNC.

To avoid instability in a practically implemented loop with some delay, the resonator 32*b* may be operated in a detuned state across the tuning range.

Because of the non-orthogonal intersection of the RNC with the device line, the Q and frequency tuning will be coupled which is a disadvantage in tuning as control becomes more complex.

Single Resonator Implementation

Referring to FIG. 19, in terms of implementation, capacitors 52 couple into resonator 32b with tank capacitor 36. It is possible to eliminate coupling capacitors 52 which simplifies the circuit. We can also make coupling capacitors 52 large coupling capacitors with relatively small reactance. However, there is little or no benefit to this, and the capacitors consume chip area.

There may, however, be an advantage in making coupling capacitors 52 of small specific values. These advantages are that an arbitrary source 46 and load 48 impedance may be realized and that the component values of the parallel resonator 32b can be more favorable.

A benefit of coupling capacitors 52 having tuned values is related to the fact that the inductance of tank 32b should be relatively small and the capacitance of tank 32b capacitance should be relatively large.

Low loss Two-Tank Resonator

Frequency Tuning

Figure 26:
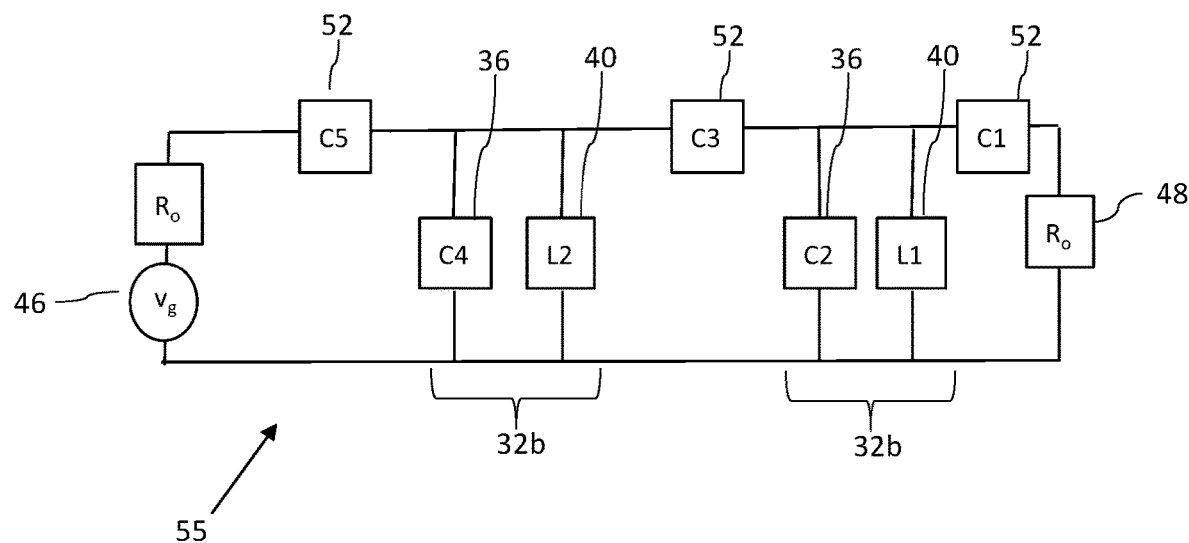
FIG. 26 is a schematic diagram of a low loss implementation of a two-tank resonator.

In this section there will be considered an example of a two-resonator multi-pole resonator 55a as shown in FIG. 26, having parallel LC resonators 32b with coupling capacitors 52. The impedance of generator 46 and load 48 is Ro.

In order to keep the tuning manageable, the parallel resonator capacitors 36 may be varied with varactor control. Capacitors 52 and tank inductors 40 may be fixed values. As an example, a tuning centered around a 3 GHz center frequency will be considered.

Capacitively Coupled Resonators

In evaluating the concept of coupling the resonators 32a and 32b with a coupling capacitor, the coupling capacitor had to be sized with the following facts in mind:

- If the coupling capacitance is small, then the coupling between the resonators is loose such that the resonance frequencies of the coupled resonator structure is essentially that of the individual resonators. This makes tuning simple, but the loss is high.
- If the coupling is made tight by increasing the coupling capacitor, then the modes couple to the point that the resonance frequencies are not the same. This makes the Nyquist contour not of constant radius, and tuning becomes difficult.
- If the coupling is increased further, then eventually one dominant resonance would emerge that is at the same frequency as the individual resonator as the L is essentially ⅓ and C is increased by a factor of 3. However, this does not help as we now essentially have a single resonator but at a higher Q. The higher Q is due to the ratio of $\sqrt{L/C} \Rightarrow \sqrt{(L/3)/(3C)}$ being ⅓ of what it was before which implies the effect of the relative loading of the combined resonator is less.

From the symmetry of FIG. 26, it would seem that one resonator should be tuned slightly lower than 3 GHz and the other slightly higher than 3 GHZ. For this example, the tuning of tank capacitors 36 are separately set to 0.99 and 1.04 of the capacitance for a 3 GHz point. FIG. 27 shows the tuned response with only the tank capacitors 36 varied.

The frequency response is seen in FIG. 28a and FIG. 28b showing the low loss passband characteristic. Further optimization can reduce the passband loss slightly further, but the present performance may be sufficient. Also shown in FIG. 28c is the RNC which is well behaved for a loop with a 180-degree phase invertor.

Referring to FIG. 26, tank capacitors 36 are around 3 pF, inductors 40 at 0.8 nH, and coupling capacitors 52 are around 1 pF. Hence the components may be easily realized.

Figure 29:
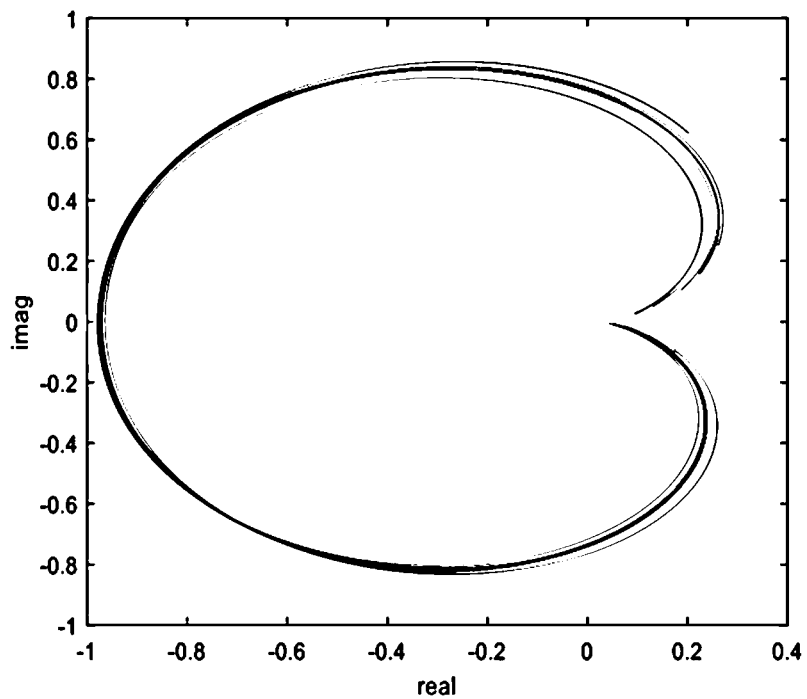
FIG. 29 is a resonant Nyquist plot of a two tank multi-pole resonator with no delay tuning.

FIG. 29 shows the RNC with no delay with the observation that the Q enhancement will be well behaved across the tuning range with 180-degree phase invertor in the loop.

Figure 30:
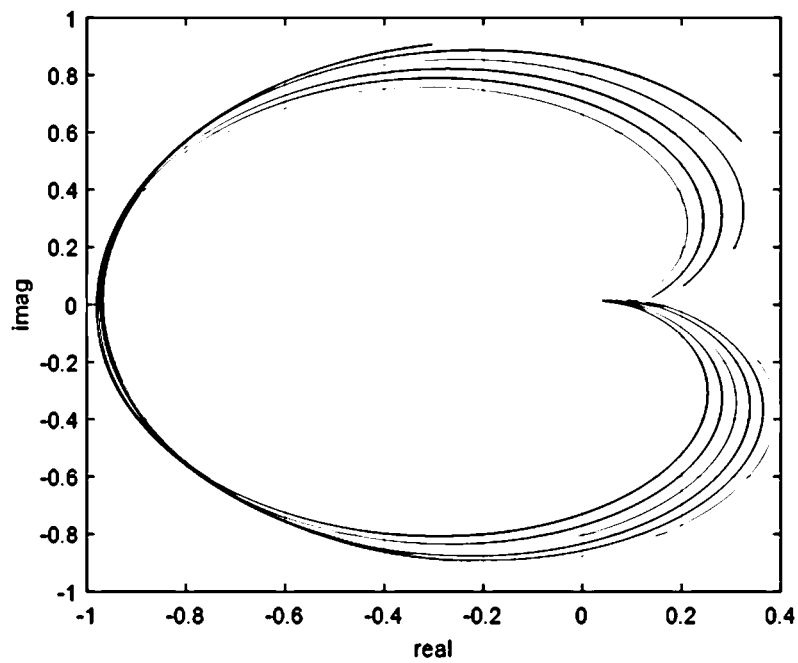
FIG. 30 is a resonant Nyquist plot of a two tank multi-pole resonator with a fixed phase adjustment and a 100 ps delay showing there is no Type II instability for moderate Q enhancement.

FIG. 30 shows the RNC for the case of a delay of 100 psec. The set of RNC curves were rotated by insertion of a fixed phase shift to maintain the negative real axis as the device line. Note that the combination of the phase shift and delay can be a part of the gain box implementation which is not specified further in this example.

The point is that through the design of the circuit loop, the optimum phase rotation can be achieved.

It is significant that the intersection of the device line and the family of RNC curves for the different tank capacitor frequency tuning cases are nearly orthogonal, thus insuring stability. This is while accommodating a 100 psec loop delay which is beyond what is practically required.

Furthermore, tank capacitors 36 can have a common varactor bias voltage with simplifies the control of frequency tuning. Hence there is no potential instability in this case.

Low Loss Three-Tank Resonator with High Stability

In the previous section, the two-tank multi-pole resonator was analyzed using an example that demonstrated:

- Low loss in the passband
- Simple frequency control based on common tuning of two varactor capacitors
- Q enhancement is well behaved with no instability issue
- A loop delay of 100 psec is accommodated without degrading potential of instability Given these promising results, the multi-pole resonator with three, and later five resonators, is considered in this section with the objective of determining if there is additional performance that justifies the additional complexity required.

For a third-order filter, both a three-tank TEE resonator 30a, and a three-tank PI resonator 30b will be considered, illustrated in FIG. 3 and FIG. 7, respectively. The three-tank TEE resonator 30a has two series resonators 32a and a parallel resonator 32b. The three tank PI resonator 30b has two parallel resonators 32b and a series resonator 32a.

Figure 31:
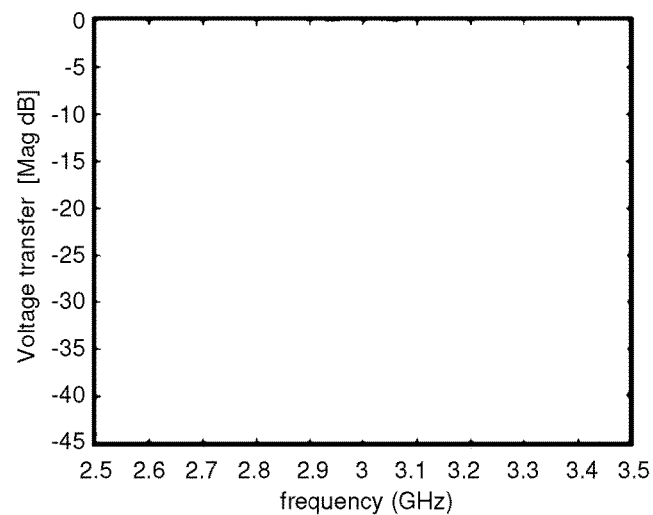
FIG. 31 is a plot of a maximally flat passband response generated from a third-order filter with a coupled TEE multi-pole resonator.

The utility of the three-tank TEE resonator 30a and the three-tank PI resonator 30b is that each enables creating a third order bandpass maximally flat passband filter that has a maximally flat passband and which gives the RNC a near constant radius in the vicinity of the point of intersection with the device line, resulting in high stability. An example of the maximally flat passband frequency response centered at 3 GHz for three-tank TEE resonator 30a of FIG. 3 is shown in FIG. 31.

A limitation of the maximally flat passband three-tank TEE resonator 30a and three-tank PI resonator 30b of FIG. 3 and FIG. 7 is that the spread of the component values may be very large which may make the circuit difficult to realize in either a surface mount or a chip integration.

In contrast, the implementation of a cascaded uncoupled multi-pole filter as shown in FIG. 1 is easily implemented but can have a high loss and requires buffers between each resonator.

A design procedure has been developed that avoids this component spread of the three-tank PI and TEE multi-pole resonators. The design procedure starts with a target center frequency, a source characteristic impedance, such as impedance 46 of FIG. 19 for example, and then a specification on the L and C component spread of three-tank TEE multi-pole resonator shown in FIG. 3 or three-tank PI multi-pole resonator shown in FIG. 7. The procedure maps this into a set of L and C values for the parallel and series resonators. The bandwidth of the multi-pole resonator is allowed to grow independently. The limitation is that the with larger bandwidth, the Q of the resonator poles is smaller such that Q enhancement has to be larger. Another problem is that if the bandwidth is too large, then the RNC may have multiple encirclements leading to unwanted spurious passbands as will be demonstrated later.

The method of designing a circuit with appropriate component values may be similar to what is discussed previously.

Figure 32:
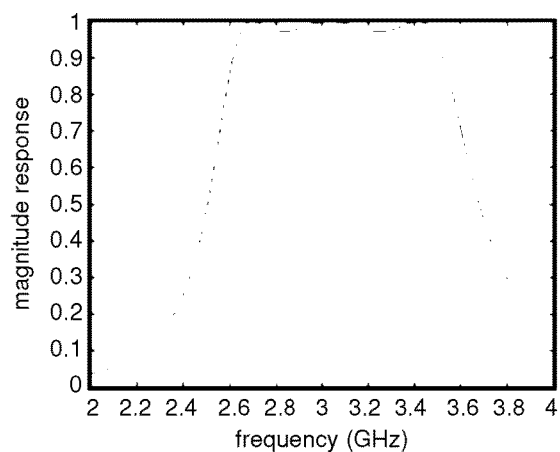
FIG. 32 is a magnitude response of an example of a coupled resonator PI network.
Figure 33:
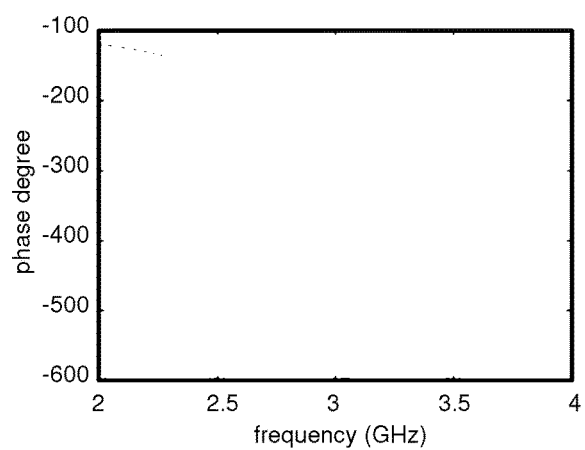
FIG. 33 is a phase response of an example of a coupled resonator PI network.
Figure 34:
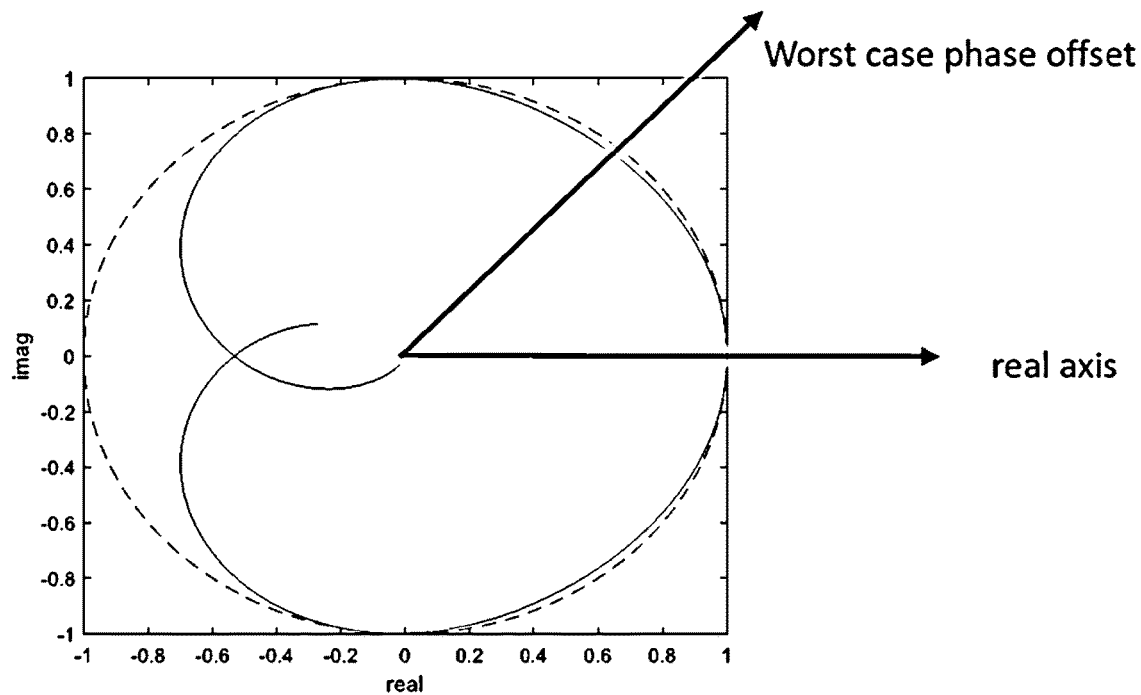
FIG. 34 is a plot of the Nyquist response of a PI network showing a worst-case phase offset of 45 degrees.

The magnitude and phase plots of three-tank PI resonator 30b are shown in FIG. 32 and FIG. 33 where it is seen that the phase is 360 degrees (or 0 degrees) and in the middle of the passband. FIG. 34 is the RNC for the PI resonator. The worst-case phase offset is shown at about 45 degrees where the deviation from the unit circle is greatest which is an indication of a limitation on the Q enhancement in a stable circuit.

Note that from the Nyquist curve of FIG. 34 a parasitic phase error of over 90 degrees can be tolerated without any encirclement. For a chip integrated version of the multi-pole variable filter there should not be a reason for having to go beyond the phase error of 90 degrees.

Figures 35A, 35B:
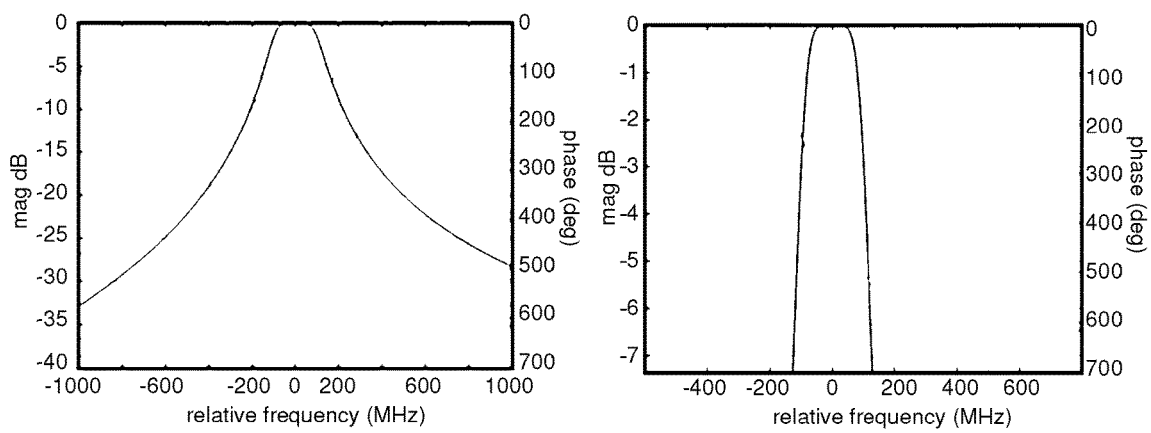
FIG. 35a is a plot that compares the magnitude and frequency of the maximally flat passband TR centered at 3 GHz with the capacitors tuned over a range of ±30%.
FIG. 35b is a zoomed in view of the plot in FIG. 35a to enlarge the magnitude scale.

FIG. 35a and FIG. 35b show the transfer function with varactor tuning capacitors tuned over a range of +30%. Note that the TR passband shape is still maximally flat throughout but becomes a narrower band for the lower frequency and a broader band for the higher frequency.

Alternate Third Order Multi-Pole Filter Using Coupled Parallel Tank Resonators

An alternate third order filter consists of coupled parallel resonators using coupling capacitors. The remarkable characteristic of this filter is that the spread of component values is very small such that it is suitable for integration at chip level.

Figure 36:
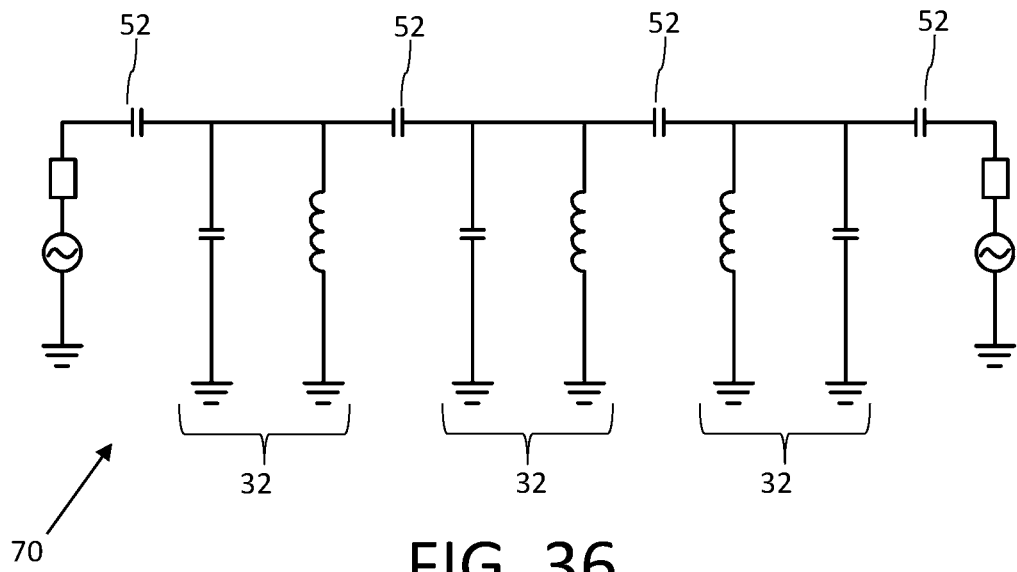
FIG. 36 is a schematic diagram of a third order filter with coupled TEE resonators showing realizable component values.

Referring to FIG. 36 a third order coupled TEE resonator 70 is shown. Note that the capacitor values only differ by a factor of about 7, and the inductors are all the same value. The three resonators have different resonant frequencies.

The filter is tuned by using varactor diodes for the three parallel resonators 64a, 64b, and 64c. Coupling capacitors 52 are initially fixed values. The frequency response is shown in FIG. 37 for different varactor capacitance values.

Note that the frequency responses have slightly tilted passbands and that the tilt increases as the tuning moves away from the center tuning at 3 GHZ. This will limit the Q enhancement that is possible for the tuning above 3 GHz. This again is due to the varactor capacitance growth with an increase in the signal amplitude. The slight increase in gain through the filter is what limits the possible Q enhancement without encountering instability.

Figure 37:
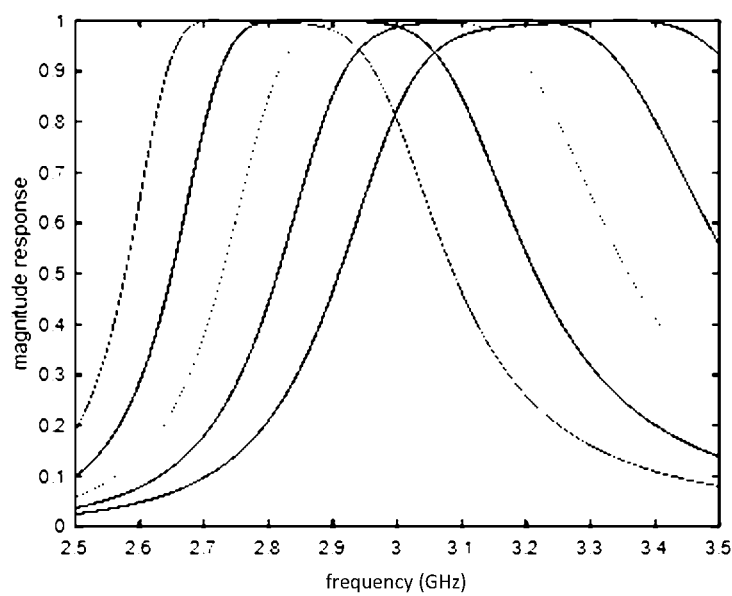
FIG. 37 is a plot of the magnitude vs. frequency of the third order filter with coupled TEE resonators for different varactor capacitance values.
Figure 38:
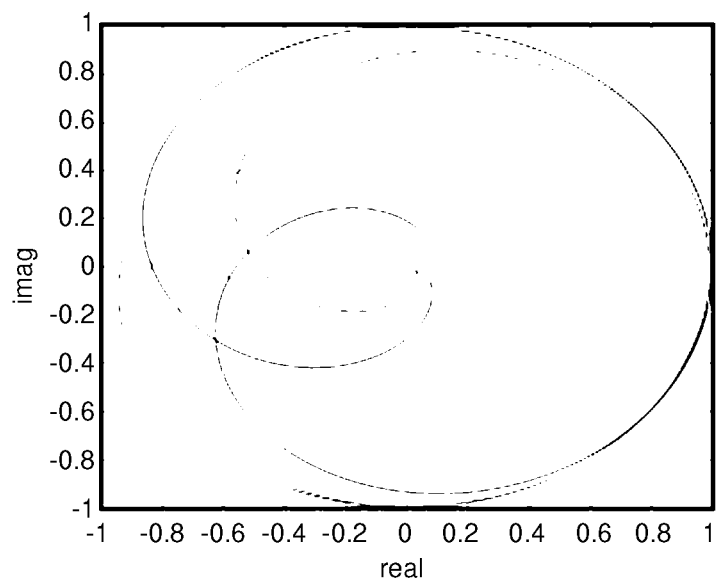
FIG. 38 is a resonator Nyquist curve of the third order filter with coupled TEE resonators for different varactor capacitance values.

FIG. 38 shows the RNC for the different capacitance tuning instances as in FIG. 37. For this analysis, a 500 psec delay was included. Note that 500 psec is far more delay than would be present in a well-designed third order filter with coupled TEE resonators 70 of FIG. 36 in a surface mount circuit. Hence third-order coupled TEE resonator 70 may not have AM-PM related instability issues for realistically high values of Q enhancement.

Figure 39:
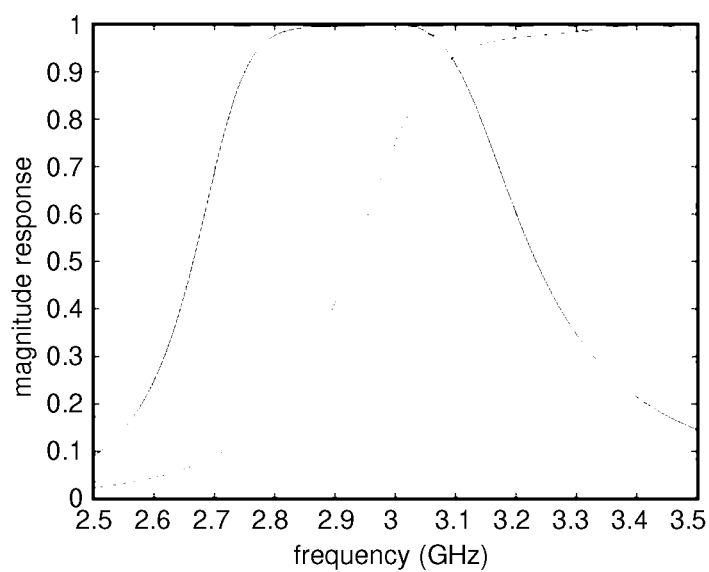
FIG. 39 is a plot of the magnitude vs. frequency of the third order filter with coupled TEE resonators for different varactor capacitance values with a 2% error in the middle resonator.
Figure 40:
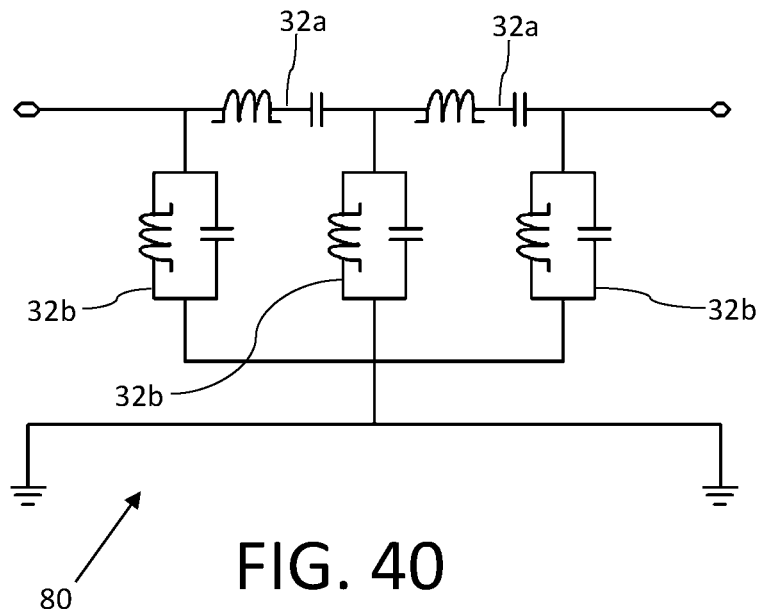
FIG. 40 is a schematic diagram of an example of a PI network for a $5^{th}$ order filter.

However, the third-order multi-pole TEE resonator 70 is moderately sensitive to component values. FIG. 39 shows the filter response with one of the inductors changed by 2%.
Increasing Passband Width by Adding Additional Poles The benefit of the added complexity of the additional poles is that the passband of the overall resonator may be increased if necessary while maintaining a higher pole Q. This means lower levels of Q enhancement are necessary. An example of a 5th order filter 80 is shown in FIG. 40 with five resonators, two of which are series resonators 32a and three of which are parallel resonators 32b.

An issue for a constant bandwidth is that the spread in component values increases: if the bandwidth is increased too far, then spurious filter bands will emerge. Additionally, the design value inductance becomes too high to implement. Fortunately, this can be reduced with a couple of additional steps of optimization. The penalty is that the passband frequency is broader. This may become an issue in that the parasitic delay of the physical loop will imply that there will be multiple Q enhanced frequency bands. These may be of use in some applications, but generally considered a nuisance and limitation.

The problem with the TEE and PI filters is still that of component spread. Hence, usable resonator implementations may be limited to 2 or 3 poles to limit the phase shift which increases when more resonators are included and causes the RNC to make more than one encirclement within the passband.
Delay Line Implementation Consider the variable filter as having a variable delay line instead of the resonator. The variable resonator will Q enhance at a frequency that is such that the phase shift around the loop is a multiple of 360 degrees. Hence a short delay line with a transfer function of $H(s)=\exp(-sT)$ where T is the delay can be implemented. This delay line can be built up with multiple sections of lumped inductors and capacitors. The delay can be tuned over a modest range by using varactor diodes. A drawback of the delay line variable filter is that multiple harmonically related passbands may emerge. But these passbands are spaced far enough apart that there is little consequence. Or else the spurious harmonic bands can be removed by additional filtering.

Figure 41:
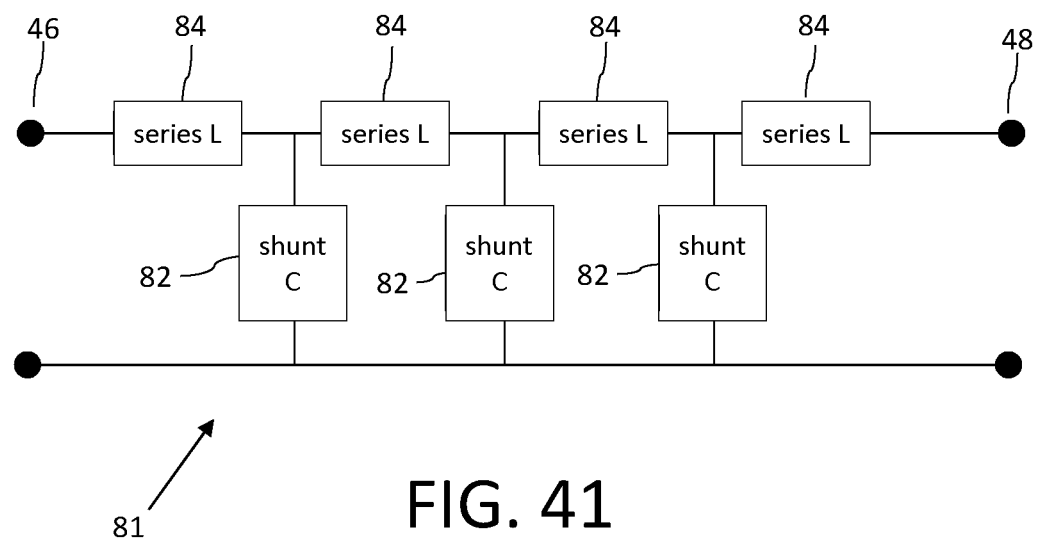
FIG. 41 is schematic diagram of a delay line synthesized from series inductance and shunt capacitance elements.

FIG. 41 shows a possible implementation of a delay line 81 consisting of series inductors 84 and shunt capacitors 82. If the values of inductors 84 and capacitors 82 are small enough, and if there are a large number of sections, then the characteristic impedance becomes $\sqrt{L/C}$ which, if matched to the source 46 and load 48 impedance, will result in a low loss network. By having varactor control of the capacitors 82 it is possible to realize a variable delay line.

Figure 42:
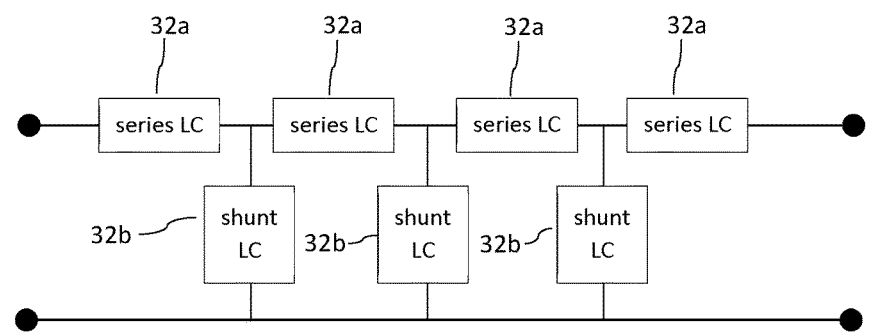
FIG. 42 is schematic diagram of a delay line synthesized from series and shunt LC resonant tanks.

Realizing that this is just a low pass filter network, we can do a lowpass to bandpass transformation to center this to the bandpass structure shown in FIG. 42. The series inductors 84 we replace with series tank resonators 32a, and the parallel capacitors 82 we replace with parallel tank resonators 32b. Now we have the additional constraint that the resonance frequency of $1/\sqrt{LC}$ is set equal to the passband frequency.

Finally, we observe that the delay line of FIG. 42 can be morphed into the slow wave structure of parallel resonant cavities coupled with series capacitors. In the implementation of FIG. 42 we can have a series resonator 32a with the inductor set to zero leaving only the coupling capacitor.

Variable delay lines will not be explored further here, except to make the point that the bandpass structures developed in previous sections are similar to delay line implementations consisting of several resonant sections.

A characteristic of the delay line in the RNC is that it typically will consist of several Nyquist encirclements giving rise to multiple points of intersection with the device line. These multiple solutions must be managed. Generally, a fixed bandpass filter in connection with the delay line is sufficient to emphasize the desired bandpass component.

The significance of the delay line discussion here is that the bandpass delay line is like the coupled resonator PI/TEE structures considered before.

Calibration of a Low Loss Linear Multi-Pole Variable Filter

In the fabrication of variable filter 10 as a low loss filter, as shown for example in FIG. 14, it is necessary that the inductive resonator components and capacitive resonator components, including varactors, are accurate to within about 2 percent. To achieve this, it may be necessary to use laser trimming during the circuit fabrication based on open loop measurements of variable filter 10. This may be automated but does add to the cost of manufacture. Additionally, it may be necessary to maintain calibration of the gain block 22.

Figure 43:
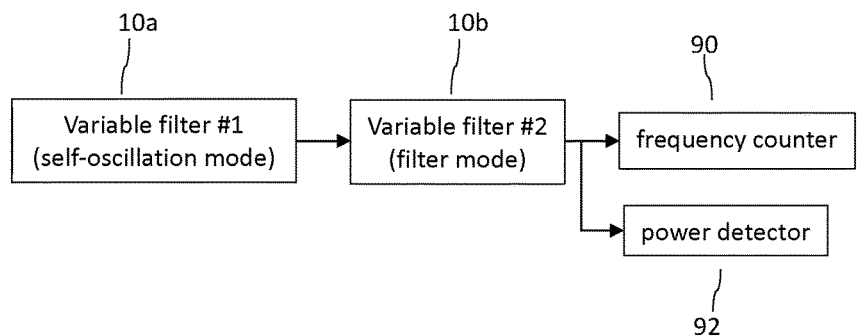
FIG. 43 is a schematic diagram of the self-calibration of a variable filter wherein the first variable filter is in self oscillation mode and the second variable filter is in filter mode with a Q-enhancement of about one.

If variable filter 10 is part of a multi-pole filter structure such that there are at least two variable filter 10 components that can be connected, then a pairwise calibration is possible as is shown in FIG. 43. This method of self-calibration is known in the art and is only included here to show that self-calibration of the variable filter 10 is still possible but may require a pair of variable filters. Typically, variable filter 10 will be part of a higher order bandpass filter that is comprised of several variable filter 10 units.

In FIG. 43, frequency counter 90 determines the oscillation frequency of the first variable filter 10a and a power detector 92 is used to determine the passband response of the second variable filter 10b. Assuming that the power detector 92 has a flat or known frequency response then the open loop response of variable filter 10b can be measured. Note that the loop gain of variable filter 10b can be set very low such that the Q enhancement factor is close to 1 giving the open loop response.

Note that the magnitude can be measured as a function of frequency, but the phase cannot be. As such the RNC cannot be determined directly. However, what is required is the flatness of the passband to be measured. There is the possibility of arranging the varactor bias circuit such that small adjustments can be made such that the tank capacitors can be adjusted separately. That is a main bias voltage affects all three of the varactors and then small additional adjustments can be added onto this main bias for each varactor. Then when the varactor bias is changed for a frequency adjustment then only the main bias needs to be changed.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings but should be given the broadest interpretation consistent with the description as a whole.

What is claimed is:

1. A variable filter for an RF circuit, comprising:
   a signal loop comprising a signal input port and a signal output port;
   a plurality of circuit elements connected within the signal loop, the plurality of circuit elements comprising:
      a multi-pole resonator comprising a first frequency tunable resonator having a first capacitance and a second frequency tunable resonator having a second capacitance, the first frequency tunable resonator being reciprocally coupled with the second frequency tunable resonator by a coupling capacitor; and
      an adjustable scaling block that applies a gain factor; and
   a controller that comprises instructions to tune the multi-pole resonator and to adjust the gain factor of the adjustable scaling block such that the signal loop generates a desired bandpass response with a desired center frequency.

2. The variable filter of claim 1, wherein the first frequency tunable resonator and the second frequency tunable resonator are independently tunable by the controller.

3. The variable filter of claim 1, wherein each of the first frequency tunable resonator and the second frequency tunable resonator comprises an inductor and a capacitor.

4. The variable filter of claim 1, wherein a reactance of one or more of the first frequency tunable resonator and the second frequency tunable resonator are selected to match input and output port impedances.

5. The variable filter of claim 1, wherein the multi-pole resonator comprises a PI configuration, a TEE configuration, or combinations thereof.

6. The variable filter of claim 1, wherein the controller comprises instructions to tune the multi-pole resonator by:
   tuning one of the first capacitance and the second capacitance to be greater than a target capacitance that corresponds to a target center frequency of the bandpass response; and
   tuning another of the first capacitance and the second capacitance to be less than the target capacitance.

7. The variable filter of claim 6, wherein the first capacitance and the second capacitance are within 4% of the target capacitance.

8. The variable filter of claim 1, wherein the controller tunes the multi-pole resonator by tuning a reactance of one or more of the plurality of frequency tunable resonators.

9. The variable filter of claim 1, wherein the coupling capacitor is a fixed capacitor.

10. The variable filter of claim 1, wherein the coupling capacitor is a variable capacitor.

11. A method of designing an RF bandpass filter, the method comprising the steps of:
   connecting a plurality of frequency tunable resonators such that adjacent frequency tunable resonators are reciprocally coupled by a coupling capacitor, wherein each frequency tunable resonator comprises an inductor and a tunable capacitor; and
   connecting the plurality of frequency tunable resonators and an adjustable scaling block that applies a gain factor in a signal loop, the signal loop comprising an input port, and an output port.

12. The method of claim 11, wherein the coupling capacitor between the adjacent frequency tunable resonators is selected to provide a desired frequency response based on a reactance of the plurality of frequency tunable resonators.

13. The method of claim 11, wherein the plurality of frequency tunable resonators are connected in a PI configuration, a TEE configuration, or combinations thereof.

14. A method of controlling a variable filter, comprising the steps of:
   providing:
      a signal loop comprising a signal input port and a signal output port, a plurality of circuit elements being connected within the signal loop, the plurality of circuit elements comprising:
         a multi-pole resonator comprising a plurality of frequency tunable resonators, wherein adjacent frequency tunable resonators within the multi-pole resonator are reciprocally coupled by coupling capacitors, each frequency tunable resonator comprising an inductor and a capacitor; and an adjustable scaling block that applies a gain factor; and tuning the multi-pole resonator and adjusting the gain factor of the adjustable scaling block such that the signal loop generates a desired bandpass response having a desired center frequency.

15. The method of claim 14, comprising the step of independently tuning two or more frequency tunable resonators.

16. The method of claim 14, wherein tuning the multi-pole resonator comprises tuning a reactance of each of the plurality of frequency tunable resonators.

17. The method of claim 14, wherein a reactance of the multi-pole resonator is selected to match input port and output port impedances.

18. The method of claim 14, wherein the plurality of frequency tunable resonators are connected in a PI configuration, a TEE configuration, or combinations thereof.

19. The method of claim 14, wherein the desired bandpass response has a target central frequency, and the tunable capacitors are tuned to within 4% of a target capacitance that corresponds to the target central frequency, at least one of the tunable capacitors being greater than the target capacitance and at least one of the tunable capacitors being less than the target capacitance.

* * * * *